(12) United States Patent
Li et al.

(10) Patent No.: US 12,388,063 B2
(45) Date of Patent: Aug. 12, 2025

(54) DISPLAY DEVICE AND METHOD FOR MANUFACTURING SAME

(71) Applicant: SAMSUNG DISPLAY CO., LTD., Yongin-si (KR)

(72) Inventors: Xinxing Li, Yongin-si (KR); Dae Hyun Kim, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 879 days.

(21) Appl. No.: 17/619,762

(22) PCT Filed: Apr. 21, 2020

(86) PCT No.: PCT/KR2020/005264
§ 371 (c)(1),
(2) Date: Dec. 16, 2021

(87) PCT Pub. No.: WO2020/256270
PCT Pub. Date: Dec. 24, 2020

(65) Prior Publication Data
US 2022/0359478 A1  Nov. 10, 2022

(30) Foreign Application Priority Data
Jun. 17, 2019 (KR) .................. 10-2019-0071660

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/24* (2013.01); *H01L 24/25* (2013.01); *H01L 24/82* (2013.01);
(Continued)

(58) Field of Classification Search
CPC ............ H01L 33/62; H01L 2933/0066; H01L 25/167; H01L 24/24; H01L 24/25;
(Continued)

(56) References Cited

U.S. PATENT DOCUMENTS 8,872,214 B2  10/2014  Negishi et al.
9,112,112 B2  8/2015  Do et al.
(Continued)

FOREIGN PATENT DOCUMENTS

EP  3 823 049  5/2021
EP  3 866 203  8/2021
(Continued)

OTHER PUBLICATIONS

International Search Report, with English translation, corresponding to International Application No. PCT/KR2020/005264 dated Aug. 14, 2020.
(Continued)

*Primary Examiner* — Matthew C Landau
*Assistant Examiner* — Halee Cramer
(74) *Attorney, Agent, or Firm* — KILE PARK REED & HOUTTEMAN PLLC

(57) ABSTRACT

A display device includes a first electrode and a second electrode disposed on a substrate and spaced apart from each other, a light emitting element on the substrate and having a first end and a second end, a third electrode disposed on the light emitting element, and electrically connecting the first electrode with the first end of the light emitting element, an insulating pattern disposed on the third electrode and exposing the second end of the light emitting element, and a fourth electrode on the substrate, and electrically connecting the second electrode with the second end of the light emitting element. A void may be formed between the light emitting element and the insulating pattern.

20 Claims, 20 Drawing Sheets

(51) Int. Cl.
*H10H 20/853* (2025.01)
*H10H 20/857* (2025.01)
*H10H 20/01* (2025.01)

(52) U.S. Cl.
CPC ........ *H10H 20/853* (2025.01); *H10H 20/857* (2025.01); *H01L 2224/24051* (2013.01); *H01L 2224/24147* (2013.01); *H01L 2224/245* (2013.01); *H01L 2224/24991* (2013.01); *H01L 2224/25174* (2013.01); *H01L 2224/25175* (2013.01); *H01L 2224/25177* (2013.01); *H01L 2224/82007* (2013.01); *H01L 2224/82106* (2013.01); *H01L 2924/0549* (2013.01); *H10H 20/0362* (2025.01); *H10H 20/0364* (2025.01)

(58) Field of Classification Search
CPC ............. H10H 20/853; H10H 20/0362; H10H 20/0364; H10H 20/032; H10H 20/83; H10H 20/818
See application file for complete search history.

(56) References Cited

U.S. PATENT DOCUMENTS

| | | | |
|---|---|---|---|
| 9,287,242 B2 | 3/2016 | Shibata et al. | |
| 9,570,425 B2 | 2/2017 | Do | |
| 9,773,761 B2 | 9/2017 | Do | |
| 9,917,235 B2 | 3/2018 | Kim | |
| 10,249,603 B2 | 4/2019 | Cho et al. | |
| 10,325,936 B2 | 6/2019 | Kang et al. | |
| 10,461,123 B2 | 10/2019 | Kim et al. | |
| 10,672,946 B2 | 6/2020 | Cho et al. | |
| 2007/0120457 A1 | 5/2007 | Goh et al. | |
| 2011/0089850 A1 | 4/2011 | Shibata et al. | |
| 2012/0086003 A1* | 4/2012 | Park | H01L 23/562 257/737 |
| 2014/0357004 A1 | 12/2014 | Sagawa | |
| 2018/0122837 A1* | 5/2018 | Kang | H10D 86/60 |
| 2018/0175106 A1 | 6/2018 | Kim et al. | |
| 2019/0172819 A1 | 6/2019 | Bae et al. | |

FOREIGN PATENT DOCUMENTS

| | | |
|---|---|---|
| JP | 4814394 | 11/2011 |
| JP | 4914929 | 4/2012 |
| KR | 10-1244926 | 3/2013 |
| KR | 10-1436123 | 11/2014 |
| KR | 10-1490758 | 2/2015 |
| KR | 10-2017-0116633 | 10/2017 |
| KR | 10-2018-0007376 | 1/2018 |
| KR | 10-2018-0046491 | 5/2018 |
| KR | 10-2018-0072909 | 7/2018 |
| KR | 10-2018-0102422 | 9/2018 |
| KR | 10-1987196 | 6/2019 |
| KR | 10-2020-0006650 | 1/2020 |
| KR | 10-2020-0130606 | 11/2020 |

OTHER PUBLICATIONS

Written Opinion, with English translation, corresponding to International Application No. PCT/KR2020/005264, dated Aug. 14, 2020.

* cited by examiner

DISPLAY DEVICE AND METHOD FOR MANUFACTURING SAME

CROSS-REFERENCE TO RELATED APPLICATION(S)

This application is a national entry of International Application No. PCT/KR2020/005264, filed on Apr. 21, 2020, which claims under 35 U.S.C. §§ 119(a) and 365(b) priority to and benefits of Korean Patent Application No. 10-2019-0071660, filed on Jun. 17, 2019, in the Korean Intellectual Property Office (KIPO), the entire contents of which are incorporated herein by reference.

BACKGROUND

1. Technical Field

Various embodiments of the disclosure relate to a display device including a light emitting element, and a method of fabricating the display device.

2. Description of Related Art

A light emitting diode (hereinafter, referred to as "LED") may have relatively satisfactory durability even under poor environmental conditions, and have excellent performances in terms of lifetime and luminance. Recently, research on the technology of applying such light emitting diodes to various display devices has become appreciably more active.

As a part of such research, technologies of fabricating a rod-type LED having a small size corresponding to the micro scale or the nano scale using an inorganic crystalline structure, e.g., a structure obtained by growing a nitride-based semiconductor are being developed. For example, rod-type LEDs may be fabricated in a small size enough to form a pixel of a self-luminance display device, etc.

SUMMARY

An object of the disclosure is to provide a display device capable of minimizing a contact failure of a light emitting element, and simplifying a fabrication process, and a method of fabricating the display device.

The objects of the disclosure are not limited to the above-stated objects, and those skilled in the art will clearly understand other not mentioned objects from the accompanying claims.

A display device in accordance with an embodiment of the disclosure may include a first electrode and a second electrode disposed on a substrate and spaced apart from each other; a light emitting element provided on the substrate and having a first end and a second end; a third electrode disposed on the light emitting element and electrically connecting the first electrode with the first end of the light emitting element; an insulating pattern disposed on the third electrode and exposing the second end of the light emitting element; and a fourth electrode disposed on the substrate and electrically connecting the second electrode with the second end of the light emitting element. A void may be formed between the light emitting element and the insulating pattern.

The insulating pattern may include a first side overlapping the light emitting element and disposed adjacent to the second electrode. The third electrode may include a second side overlapping the light emitting element and disposed adjacent to the second electrode. The second side may be closer to the first electrode than the first side is, in a plan view.

The void may be surrounded by a portion of the light emitting element, a portion of the third electrode, a portion of the insulating pattern, and a portion of the fourth electrode.

The insulating pattern may include an organic insulating layer including an organic material, and the insulating pattern may overlap at least a portion of the second side of the third electrode.

The insulating pattern may include an inorganic insulating layer including at least one of silicon oxide, silicon nitride, and silicon oxynitride, and the insulating pattern may not overlap the second side of the third electrode.

The display device may further include an insulating layer disposed on the first electrode and the second electrode. The insulating layer may include a first contact hole through which a portion of the first electrode is exposed, and a second contact hole through which a portion of the second electrode is exposed.

The third electrode may be electrically connected to the first electrode through the first contact hole, the fourth electrode may be electrically connected to the second electrode through the second contact hole, and the third electrode and the fourth electrode may be electrically disconnected from each other.

The insulating layer may include an inorganic insulating layer including an inorganic material, and a groove may be formed between the insulating layer and the light emitting element.

A display device in accordance with an embodiment of the disclosure may include a first electrode and a second electrode disposed on a substrate and spaced apart from each other; a light emitting element disposed on the substrate and having a first end and a second end; a third electrode disposed on the light emitting element and electrically connecting the first electrode with the first end of the light emitting element; an insulating pattern disposed on the third electrode and exposing the second end of the light emitting element; and a fourth electrode disposed on the substrate and electrically connecting the second electrode with the second end of the light emitting element. At least a portion of the insulating pattern may contact the light emitting element.

The insulating pattern may include a first side overlapping the light emitting element and disposed adjacent to the second electrode. The third electrode may include a second side overlapping the light emitting element and disposed adjacent to the second electrode. The second side may be closer to the first electrode than the first side is, in a plan view.

The insulating pattern may include an organic insulating layer including an organic material and overlap at least a portion of the second side of the third electrode.

The display device may include an insulating layer disposed on the first electrode and the second electrode. The insulating layer may include a first contact hole through which a portion of the first electrode is exposed, and a second contact hole through which a portion of the second electrode is exposed.

The third electrode may be electrically connected to the first electrode through the first contact hole, the fourth electrode may be electrically connected to the second electrode through the second contact hole, and the third electrode and the fourth electrode may be electrically disconnected from each other.

A method of fabricating a display device in accordance with an embodiment of the disclosure may include forming a first electrode and a second electrode on a substrate; forming a first insulating material layer on the first electrode, the second electrode, and the substrate; forming, by patterning the first insulating material layer, a first insulating layer exposing a portion of the first electrode and a portion of the second electrode; supplying light emitting elements onto the first insulating layer and self-aligning the light emitting elements; sequentially forming a conductive material layer and a second insulating material layer on the light emitting elements and the first insulating layer; forming an insulating pattern exposing a first end of the light emitting element by patterning the conductive material layer and the second insulating material layer by a first etching process; forming a third electrode by etching the patterned conductive material layer through a second etching process using the insulating pattern as a mask, wherein the third electrode may include an end overlapping the light emitting element, have an under-cut shape, and be electrically connected with a second end of the light emitting element; and forming a fourth electrode electrically connected with the second electrode and the first end of the light emitting element on the first insulating layer.

The first etching process may include a dry etching process, and the second etching process may include a wet etching process.

The insulating pattern may include an organic insulating layer including an organic material. The method may further include curing the insulating pattern after the forming of the third electrode and the forming of the fourth electrode. The insulating pattern may fill at least a portion of the under-cut shape of the third electrode.

At least a portion of the insulating pattern may contact the light emitting element.

The insulating pattern may include an inorganic insulating layer including an inorganic material. The forming of the fourth electrode may include forming a void surrounded by a portion of the light emitting element, a portion of the third electrode, a portion of the insulating pattern, and a portion of the fourth electrode.

The third electrode may be electrically disconnected from the fourth electrode.

The method may further include forming a second insulating layer overlapping the third electrode and the fourth electrode on the third electrode and the fourth electrode.

Details of various embodiments are included in the detailed descriptions and drawings.

Various embodiments of the disclosure may provide a display device capable of preventing a contact failure of a light emitting element from being caused, and simplifying a fabrication process, and a method of fabricating the display device.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1A:
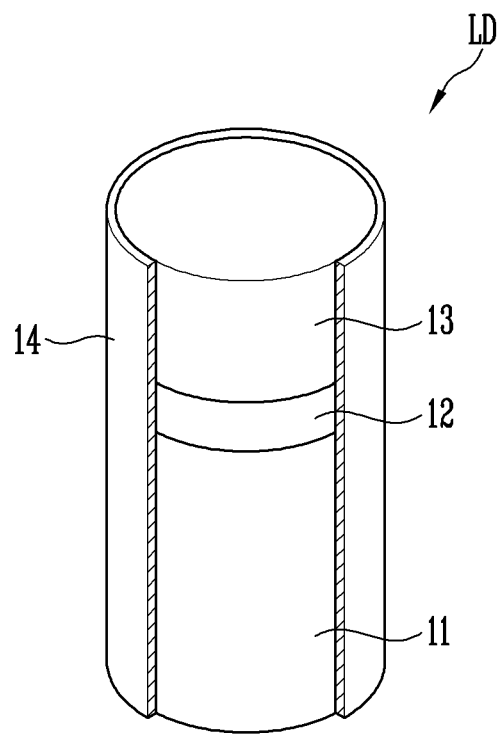
FIGS. 1A and 1B are perspective views each schematically illustrating a light emitting element in accordance with an embodiment of the disclosure.

Advantages and features of the disclosure, and methods for achieving the same will be cleared with reference to embodiments described later in detail together with the accompanying drawings. The disclosure may, however, be embodied in many different forms and should not be construed as being limited to the embodiments set forth herein. Rather, these embodiments are provided so that this disclosure will be thorough and complete and will convey the concept of the disclosure to those skilled in the art, and the disclosure will only be defined by the appended claims.

It will be understood that when an element or a layer is referred to as being "on" another element or a layer, it can be directly on, connected to, or coupled to the other element or the layer, or one or more intervening elements or layers may be present. Like reference numerals refer to like elements throughout.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. In the disclosure, the singular forms are intended to include the plural forms as well, unless the context clearly indicates otherwise.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the attached drawings.

Figure 1B:
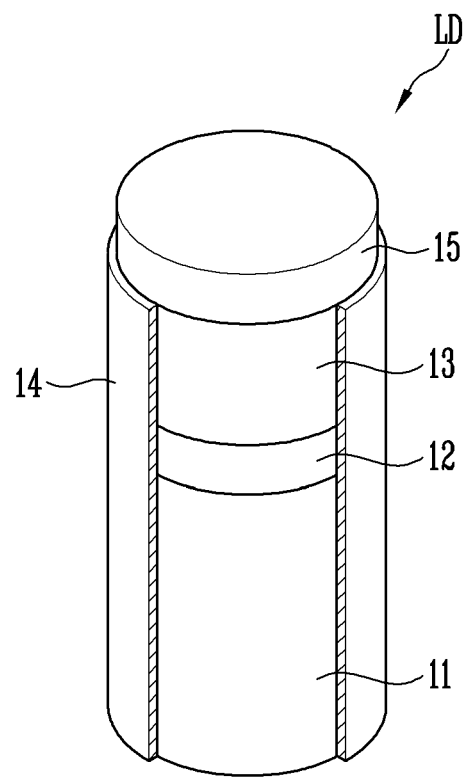

FIGS. 1A and 1B are schematic perspective views each illustrating a light emitting element in accordance with an embodiment. Although FIGS. 1A and 1B illustrate a cylindrical light emitting element LD, the disclosure is not limited thereto.

Referring to FIGS. 1A and 1B, a light emitting element LD may include a first conductive semiconductor layer 11 (or a first semiconductor layer), a second conductive semiconductor layer 13 (or a second semiconductor layer), and an active layer 12 interposed between the first and second conductive semiconductor layers 11 and 13.

For example, the light emitting element LD may be implemented as a stacked body formed by successively stacking the first conductive semiconductor layer 11, the active layer 12, and the second conductive semiconductor layer 13.

In an embodiment, the light emitting element LD may be provided in the form of a rod extending in a direction. If the direction in which the light emitting element LD extends is defined as a longitudinal direction, the light emitting element LD may have a first end and a second end in the longitudinal direction.

In an embodiment, one of the first and second conductive semiconductor layers 11 and 13 may be disposed on the first end, and the other of the first and second conductive semiconductor layers 11 and 13 may be disposed on the second end.

In an embodiment, the light emitting element LD may be provided in a cylindrical shape. The term "rod type" refers to a rod-like shape and a bar-like shape such as a cylindrical shape and a prismatic shape extending in the longitudinal direction (for example, to have an aspect ratio greater than 1). For example, the length of the light emitting element LD may be greater than the diameter thereof.

The light emitting element LD may be fabricated in a small size having a diameter and/or length corresponding to, e.g., a microscale or nanoscale size.

However, the size of the light emitting element LD is not limited thereto, and the size of the light emitting element LD may be changed depending on conditions of the display device to which the light emitting element LD is applied.

The first conductive semiconductor layer 11 may include, e.g., at least one n-type semiconductor layer. For instance, the first conductive semiconductor layer 11 may include a semiconductor layer which includes a semiconductor material of InAlGaN, GaN, AlGaN, InGaN, AlN, and InN and is doped with a first conductive dopant such as Si, Ge, or Sn.

The material forming the first conductive semiconductor layer 11 is not limited thereto, and the first conductive semiconductor layer 11 may be formed of (or include) various other materials.

The active layer 12 may be formed on the first conductive semiconductor layer 11 and have a single or multi-quantum well structure. In an embodiment, a cladding layer (not shown) doped with a conductive dopant may be formed on and/or under the active layer 12. For example, the cladding layer may be formed of an AlGaN layer or an InAlGaN layer. A material such as AlGaN or AlInGaN may be employed to form the active layer 12.

If an electric field of a predetermined voltage or more is applied to the opposite ends of the light emitting element LD, the light emitting element LD emits light by combination of electron-hole pairs in the active layer 12.

The second conductive semiconductor layer 13 (or the second semiconductor layer) may be provided on the active layer 12 and include a semiconductor layer having a type different from that of the first conductive semiconductor layer 11. For example, the second conductive semiconductor layer 13 may include at least one p-type semiconductor layer. For instance, the second conductive semiconductor layer 13 may include a semiconductor layer which includes a semiconductor material of InAlGaN, GaN, AlGaN, InGaN, AlN, and InN and is doped with a second conductive dopant such as Mg.

The material forming the second conductive semiconductor layer 13 is not limited thereto, and the second conductive semiconductor layer 13 may be formed of various other materials.

In an embodiment, the light emitting element LD may include the first conductive semiconductor layer 11, the active layer 12, and the second conductive semiconductor layer 13, and may also include a fluorescent layer, another active layer, another semiconductor layer, and/or an electrode layer provided on and/or under each layer (e.g., the first conductive semiconductor layer 11, the active layer 12, and the second conductive semiconductor layer 13).

In an embodiment, the light emitting element LD may further include at least one electrode layer disposed on a side (e.g., an upper surface) of the second conductive semiconductor layer 13 or a side (e.g., a lower surface) of the first conductive semiconductor layer 11.

For example, as illustrated in FIG. 1B, the light emitting element LD may further include an electrode layer 15 disposed on a side of the second conductive semiconductor layer 13. The electrode layer 15 may be an ohmic contact electrode, but the disclosure is not limited thereto. Furthermore, the electrode layer 15 may include metal or a metal oxide. For example, chromium (Cr), titanium (Ti), aluminum (Al), gold (Au), nickel (Ni), and an oxide or alloy thereof, or a transparent conductive material such as indium tin oxide (ITO) may be used alone or in combination with each other. However, the disclosure is not limited thereto. In an embodiment, the electrode layer 15 may be substantially transparent or translucent. Thus, light generated from the light emitting element LD may be emitted to the outside after passing through the electrode layer 15.

The light emitting element LD may further include an insulating film 14. In an embodiment, the insulating film 14 may be omitted or may be provided to cover only some of the first conductive semiconductor layer 11, the active layer 12, and the second conductive semiconductor layer 13.

For example, the insulating film 14 may be provided on a portion of the light emitting element LD, other than the opposite ends thereof, so that the opposite ends of the light emitting element LD are exposed.

For the sake of explanation, FIGS. 1A and 1B illustrate the insulating film 14 a portion of which has been removed. The entirety of the side surface of the light emitting element LD may be enclosed (or surrounded) by the insulating film 14.

The insulating film 14 may be provided to enclose at least a portion of an outer circumferential surface of the first conductive semiconductor layer 11, the active layer 12, and/or the second conductive semiconductor layer 13. For example, the insulating film 14 may enclose the outer circumferential surface of the active layer 12. In case that the light emitting element LD include the electrode layer 15, the insulating film 14 may enclose at least a portion of an outer circumferential surface of the electrode layer 15.

In an embodiment, the insulating film 14 may include a transparent insulating material. For example, the insulating film 14 may include at least one insulating material selected from the group consisting of $SiO_2$, $Si_3N_4$, $Al_2O_3$, and $TiO_2$, but the disclosure is not limited thereto. In other words, various materials having insulating properties may be employed.

If the insulating film 14 is provided on the light emitting element LD, the active layer 12 may be prevented from short-circuiting with a first and/or second electrode (not illustrated).

Furthermore, by virtue of the insulating film 14, occurrence of a defect on the surface of the light emitting element LD may be minimized, whereby the lifespan and efficiency of the light emitting element LD may be improved. In case that light emitting elements LD are disposed in close contact with each other, the insulating film 14 may prevent an undesired short circuit from occurring between the light emitting elements LD.

The light emitting element LD may be employed as a light source for various display devices. For example, the light emitting element LD may be used as a light source element for a lighting apparatus or a self-emissive display device.

Figure 2A:
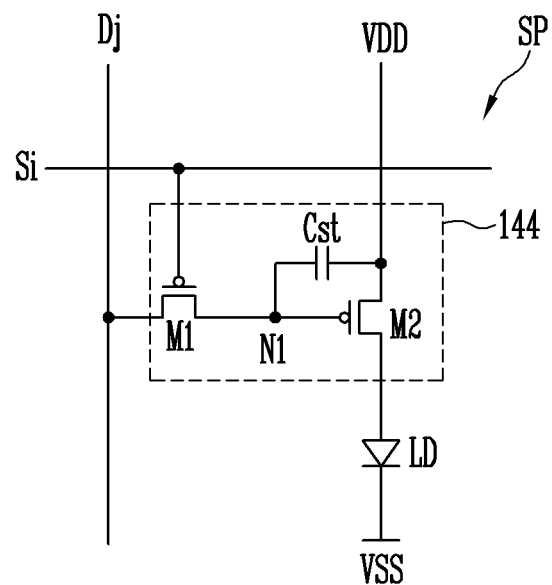
FIGS. 2A and 2B are diagrams of equivalent circuits each schematically illustrating a unit emission area of a display device in accordance with an embodiment of the disclosure.
Figure 2B:
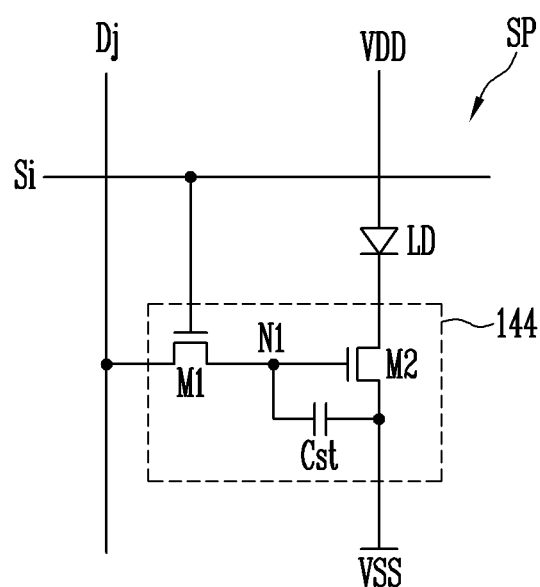

FIGS. 2A and 2B are schematic diagrams of equivalent circuits each illustrating an emission area (or unit emission area) of a display device in accordance with an embodiment.

FIGS. 2A and 2B illustrate examples of a pixel that forms an active emission display panel. In an embodiment, the unit emission area may be a pixel area in which a single sub-pixel is provided.

Referring to FIG. 2A, a sub-pixel SP may include at least one light emitting element LD, and a pixel driving circuit 144 which is electrically connected to the light emitting element LD to drive the light emitting element LD.

The light emitting element LD may include a first electrode (e.g., an anode electrode) electrically connected to a first driving power supply VDD via the pixel driving circuit 144, and a second electrode (e.g., a cathode electrode) electrically connected to a second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the light emitting element LD.

Each of the light emitting elements LD may emit light at a luminance corresponding to driving current that is controlled by the pixel driving circuit 144.

Although FIG. 2A illustrates an embodiment in which the sub-pixel SP includes only a light emitting element LD, the disclosure is not limited thereto. For example, the sub-pixel SP may include light emitting elements LD electrically connected in parallel to each other.

In an embodiment, the pixel driving circuit 144 may include first and second transistors M1 and M2, and a storage capacitor Cst. However, the structure of the pixel driving circuit 144 is not limited to the embodiment illustrated in FIG. 2A.

The first transistor M1 (a switching transistor) includes a first electrode electrically connected to a data line Dj, and a second electrode electrically connected to a first node N1. The first electrode and the second electrode of the first transistor M1 may be different electrodes. For example, if the first electrode is a source electrode, the second electrode is a drain electrode. Furthermore, the first transistor M1 includes a gate electrode electrically connected to the scan line S1.

In case that a scan signal having a voltage (e.g., a low-level voltage) capable of turning on the first transistor M1 is supplied from the scan line S1, the first transistor M1 is turned on to electrically connect the data line Dj with the first node N1. A data signal of a corresponding frame is supplied to the data line Dj, whereby the data signal is transmitted to the first node N1. The storage capacitor Cst may be charged with the data signal transmitted to the first node N1.

The second transistor M2 (a driving transistor) may include a first electrode electrically connected to the first driving power supply VDD, and a second electrode electrically connected to the first electrode of each of the light emitting elements LD. The second transistor M2 includes a gate electrode electrically connected to the first node N1. The second transistor M2 may control the amount of driving current to be supplied to the light emitting elements LD in response to the voltage of the first node N1.

An electrode of the storage capacitor Cst is electrically connected to the first driving power supply VDD, and another electrode thereof is electrically connected to the first node N1. The storage capacitor Cst may be charged with a voltage corresponding to the data signal supplied to the first node N1, and maintain the charged voltage until a data signal of a subsequent frame is supplied.

For the sake of explanation, FIG. 2A illustrates the driving circuit (or pixel driving circuit) 144 having a relatively simple structure including the first transistor M1 configured to transmit the data signal supplied to the sub-pixel SP, the storage capacitor Cst configured to store the data signal, and the second transistor M2 configured to supply driving current corresponding to the data signal to the light emitting element LD.

However, the disclosure is not limited to the foregoing structure, and the structure of the pixel driving circuit 144 may be changed in various ways. For example, the pixel driving circuit 144 may further include at least one transistor element such as a transistor element configured to compensate for the threshold voltage of the second transistor M2, a transistor element configured to initialize the first node N1, and/or a transistor element configured to control an emission time of the light emitting element LD, or other circuit elements such as a boosting capacitor for boosting the voltage of the first node N1.

Furthermore, although FIG. 2A illustrates that the transistors, e.g., the first and second transistors M1 and M2, included in the pixel driving circuit 144 are formed of P-type transistors, the disclosure is not limited thereto. In other words, at least one of the first and second transistors M1 and M2 included in the pixel driving circuit 144 may be changed to an N-type transistor.

Referring to FIG. 2B, the first and second transistors M1 and M2 may be implemented as N-type transistors. The configuration and operation of the pixel driving circuit 144 illustrated in FIG. 2B may be different from those of the pixel driving circuit 144 of FIG. 2A at least in connection positions of some components due to a change in the type of transistor. Therefore, detailed descriptions pertaining to this will be omitted.

Figure 3:
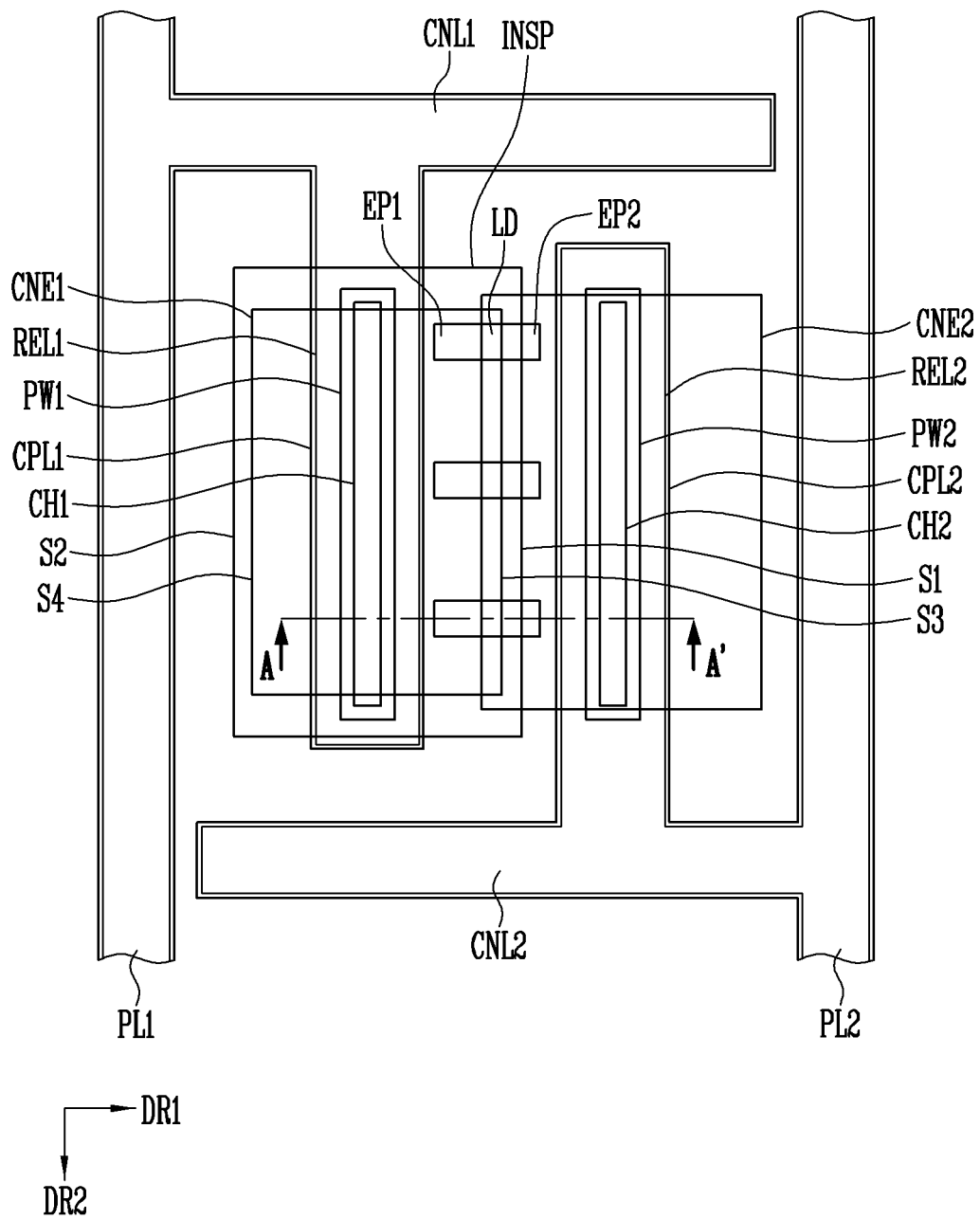
FIG. 3 is a plan view schematically illustrating a unit emission area of the display device.
Figure 4A:
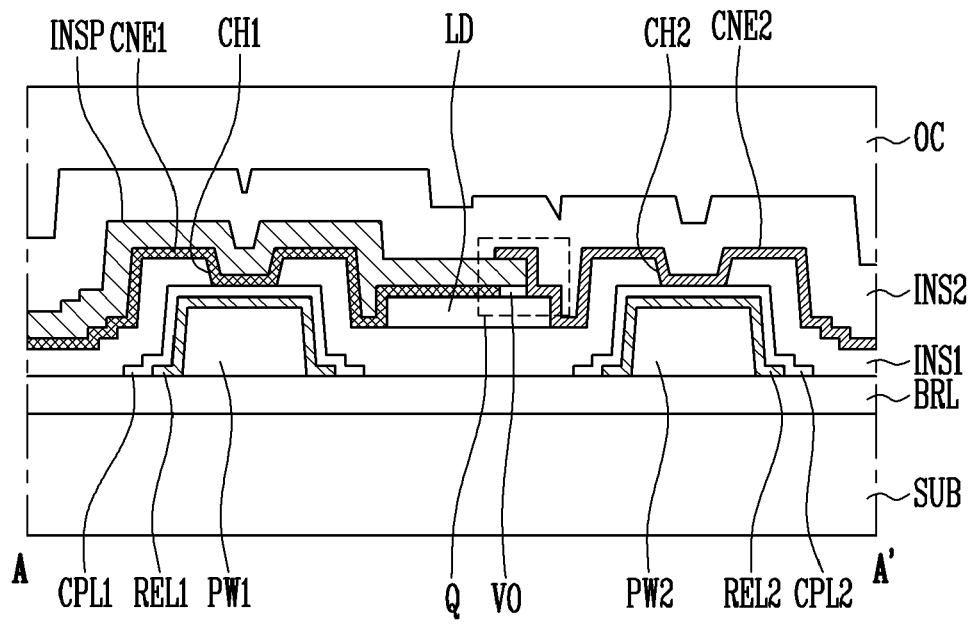
FIGS. 4A and 4B are cross-sectional views taken along line A-A' of FIG. 3.
Figure 4B:
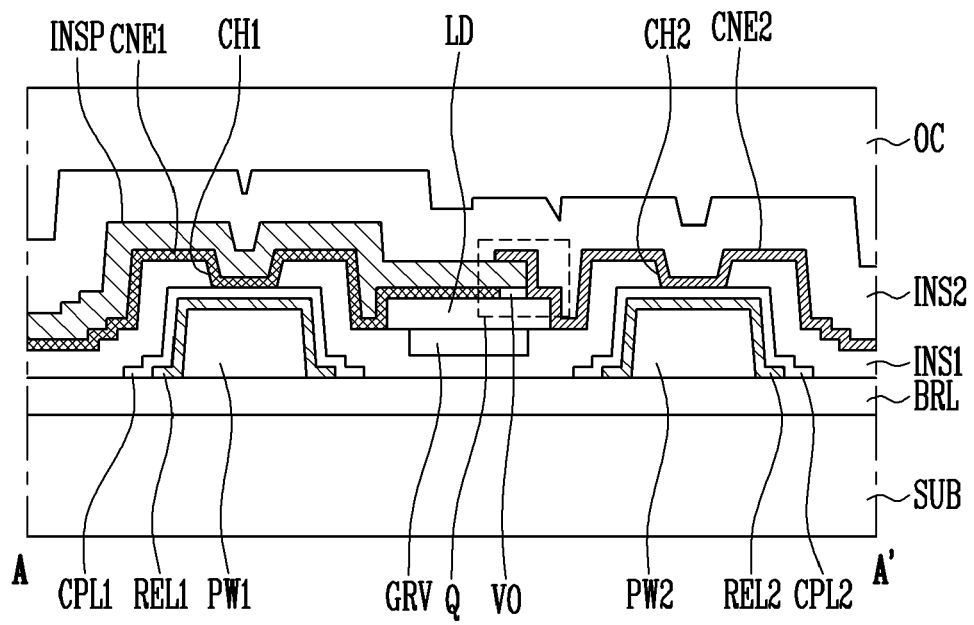
Figure 5A:
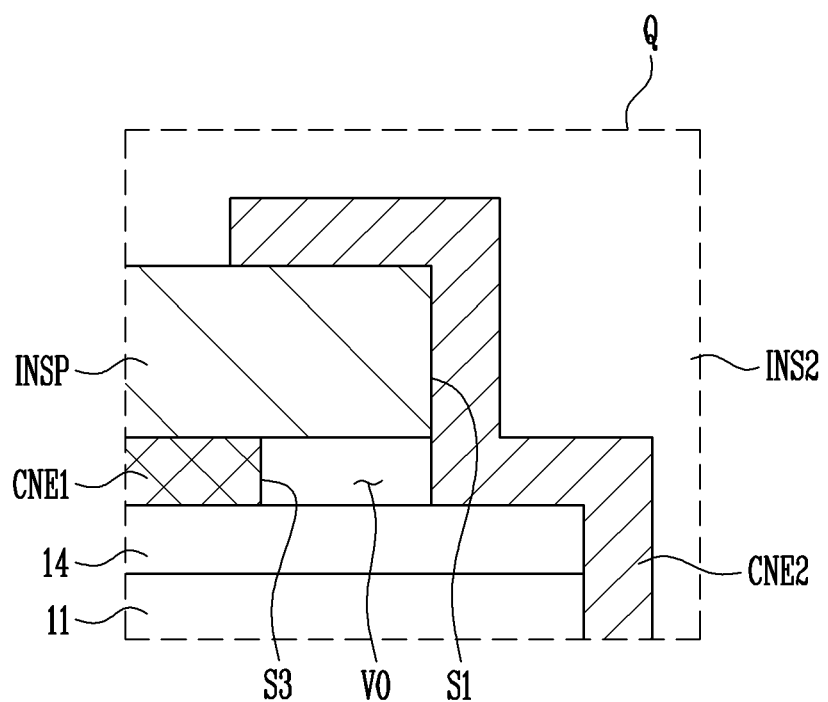
FIG. 5A is an enlarged cross-sectional view of area Q of FIG. 4A.
Figure 5B:
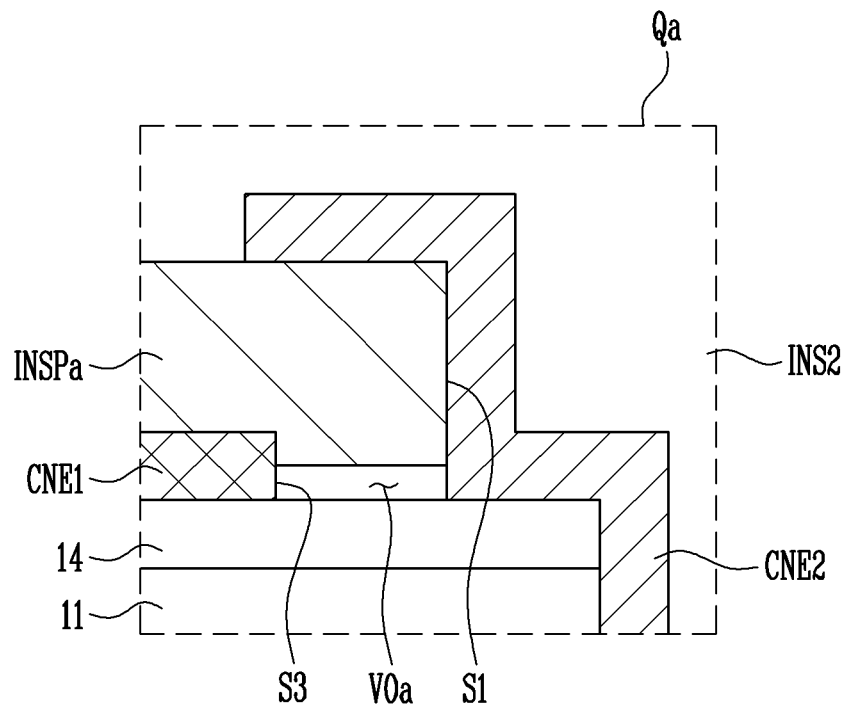
FIGS. 5B and 5C are modification examples of a structure shown in FIG. 5A.
Figure 5C:
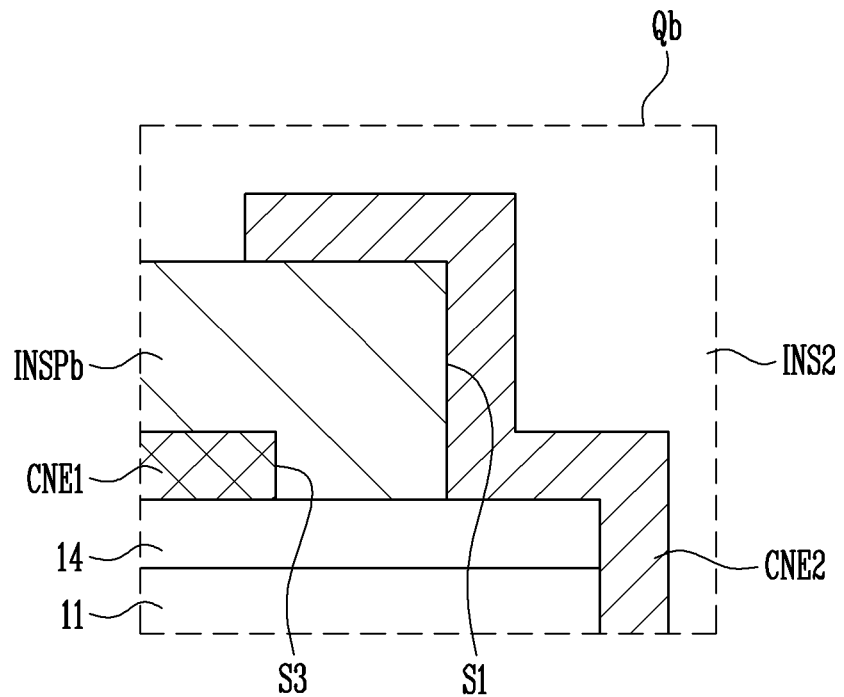
Figure 6A:
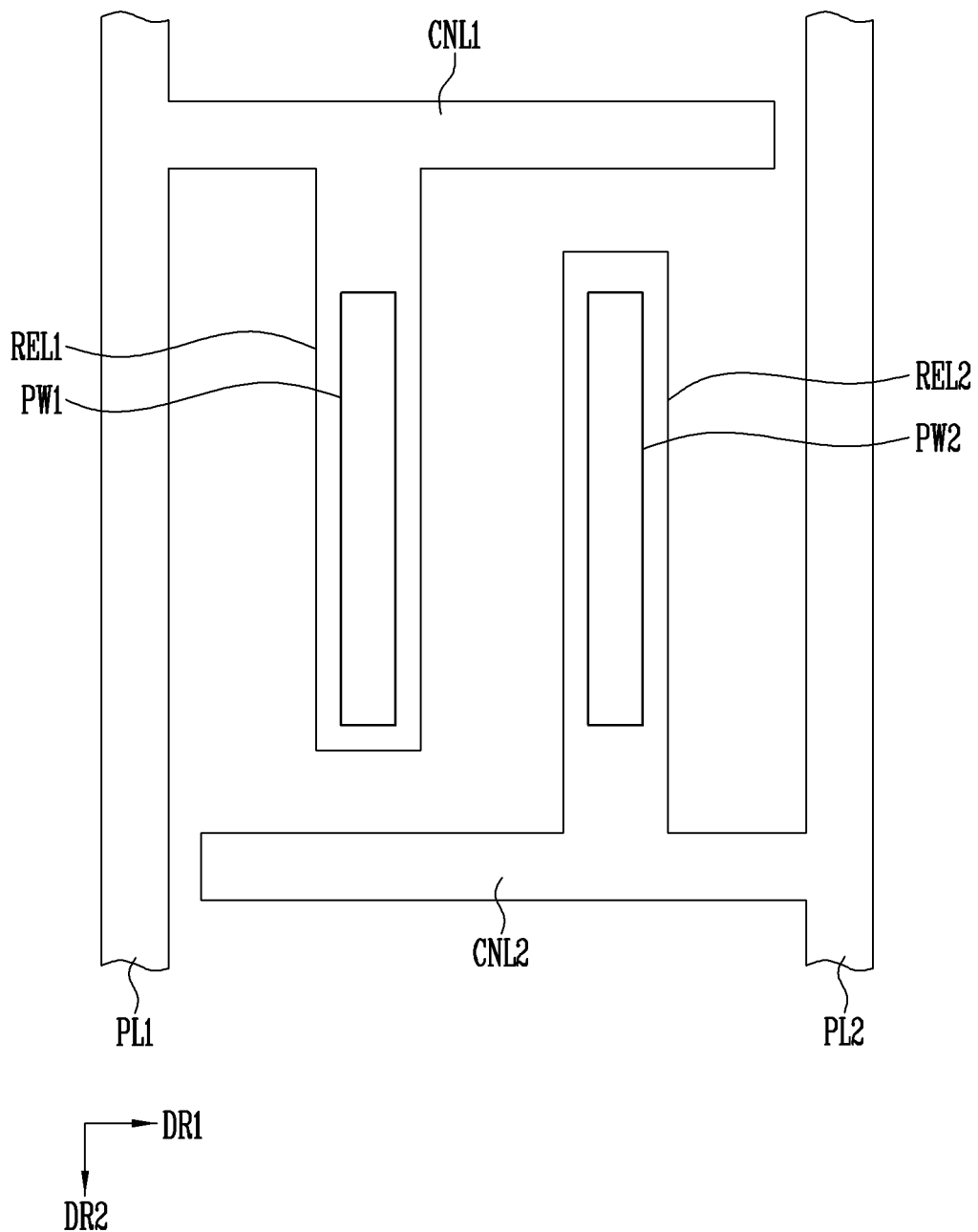
FIGS. 6A to 6F are schematic plan views sequentially illustrating a method of fabricating the display device of FIG. 3.
Figure 6B:
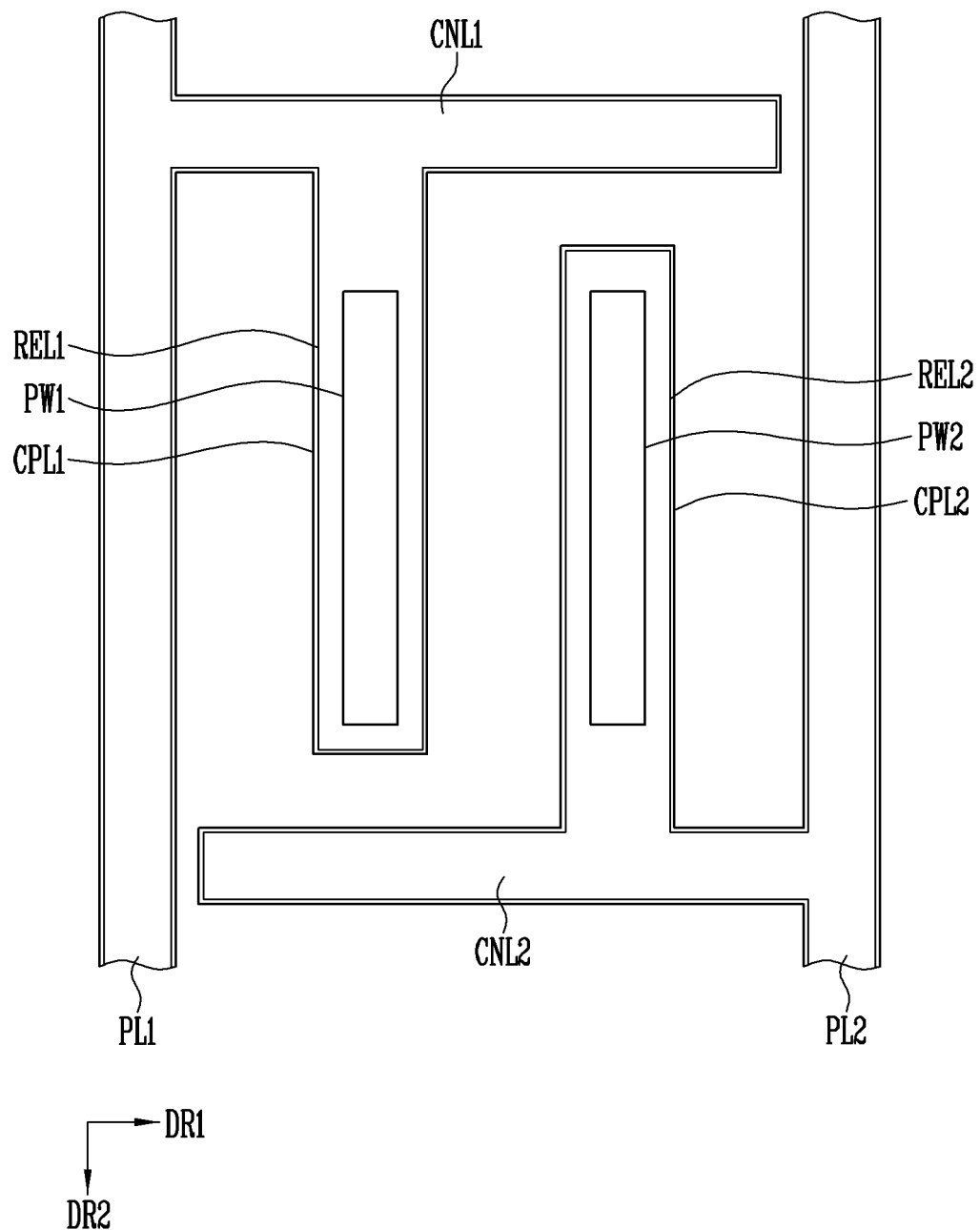
Figure 6C:
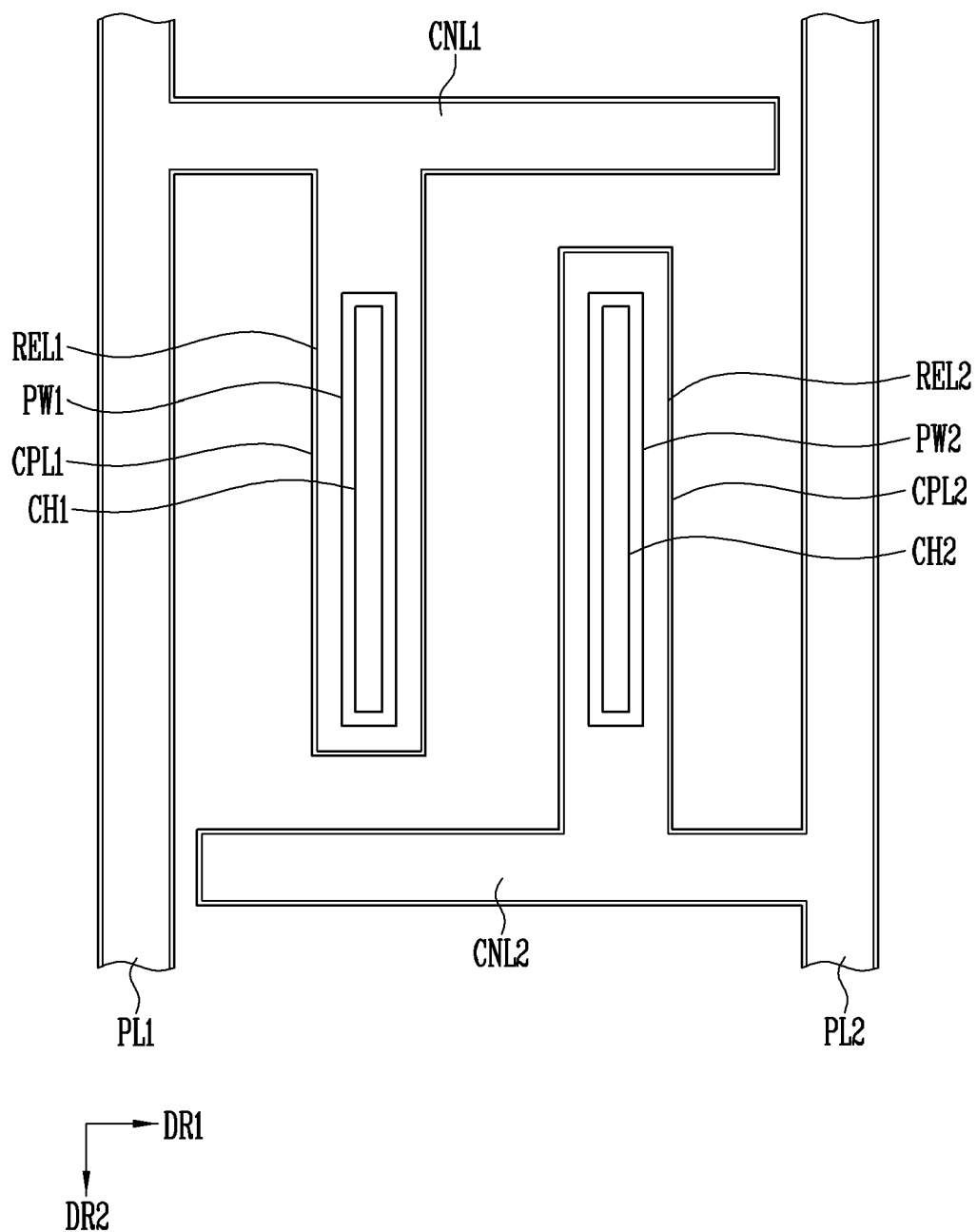
Figure 6D:
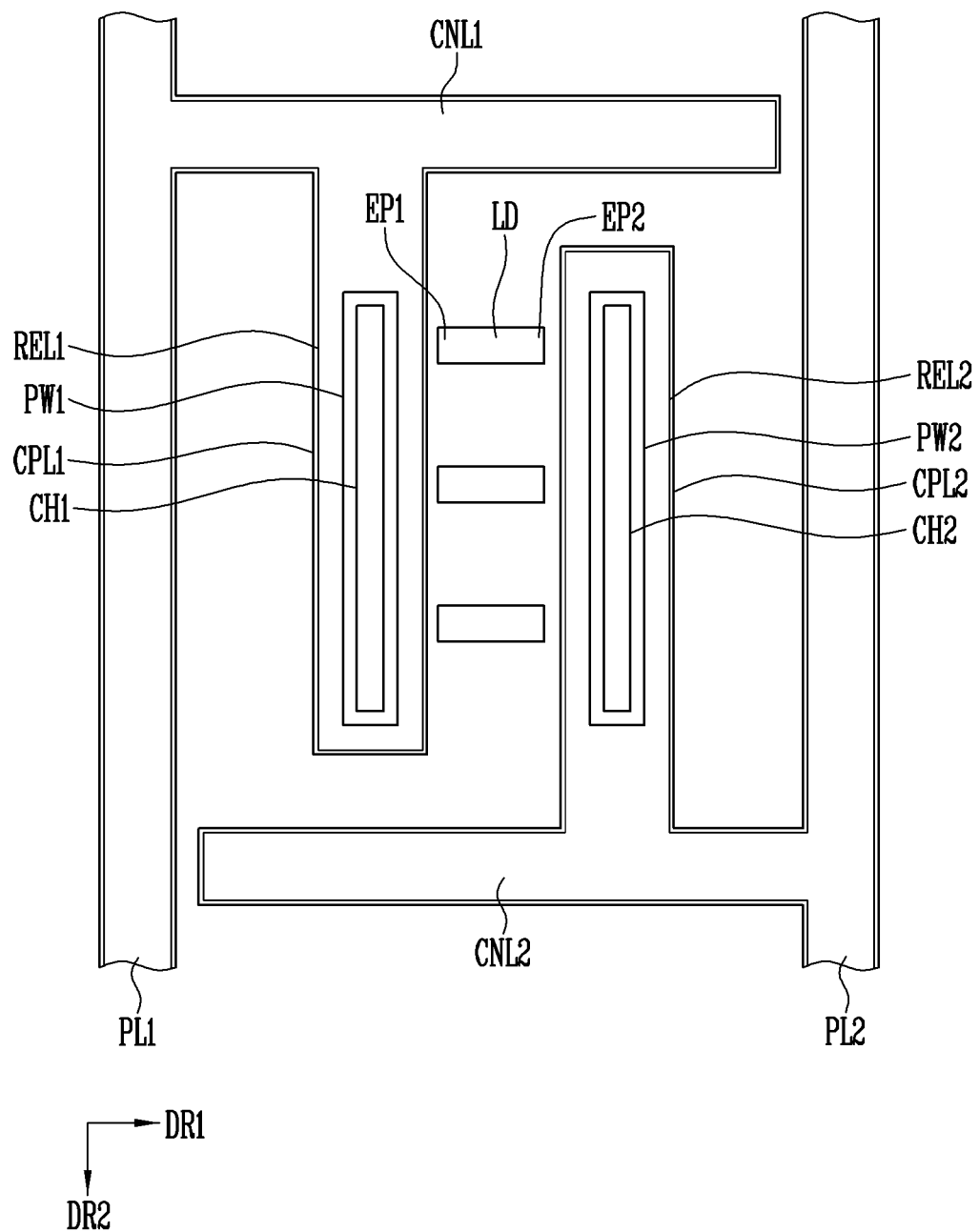
Figure 6E:
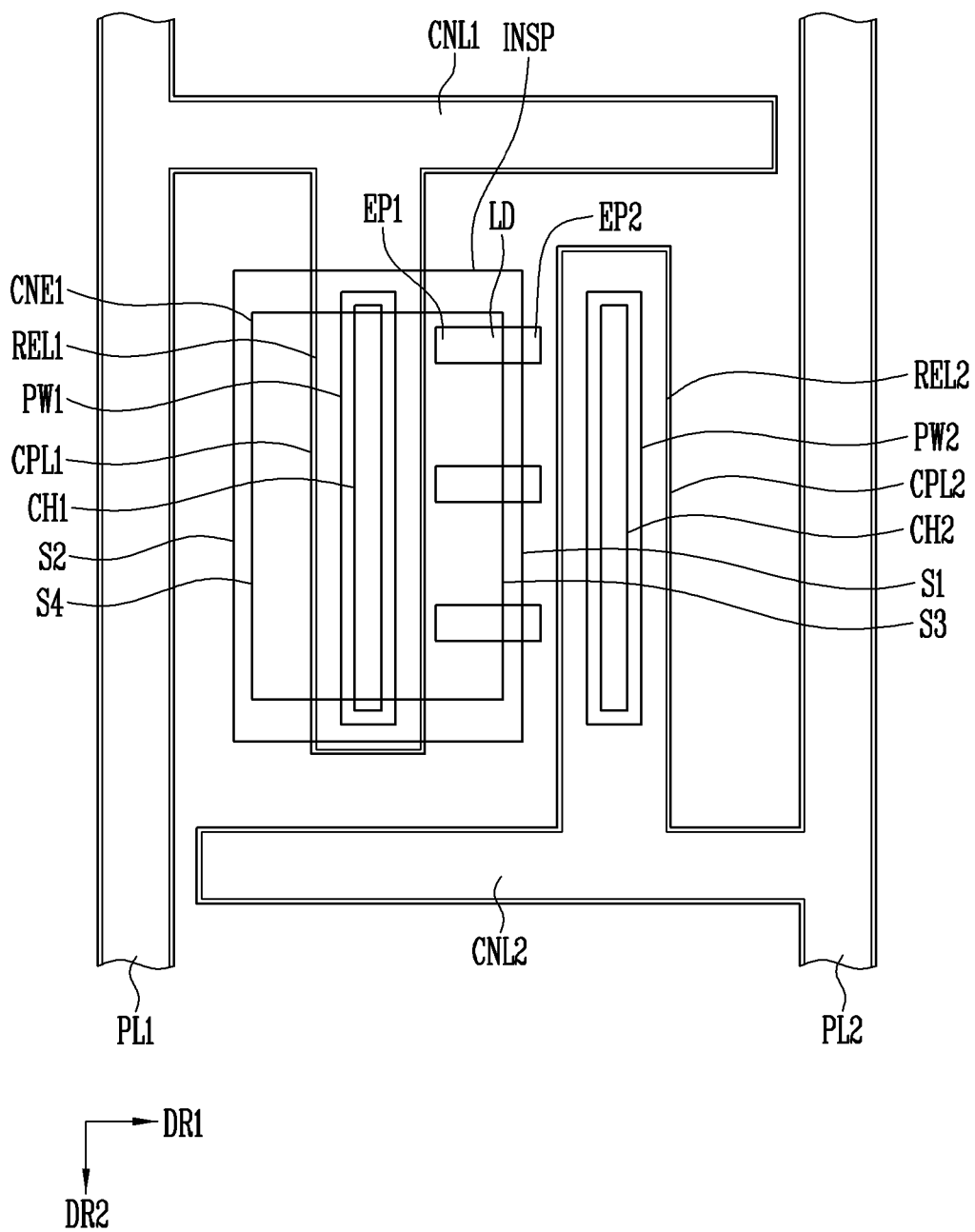
Figure 6F:
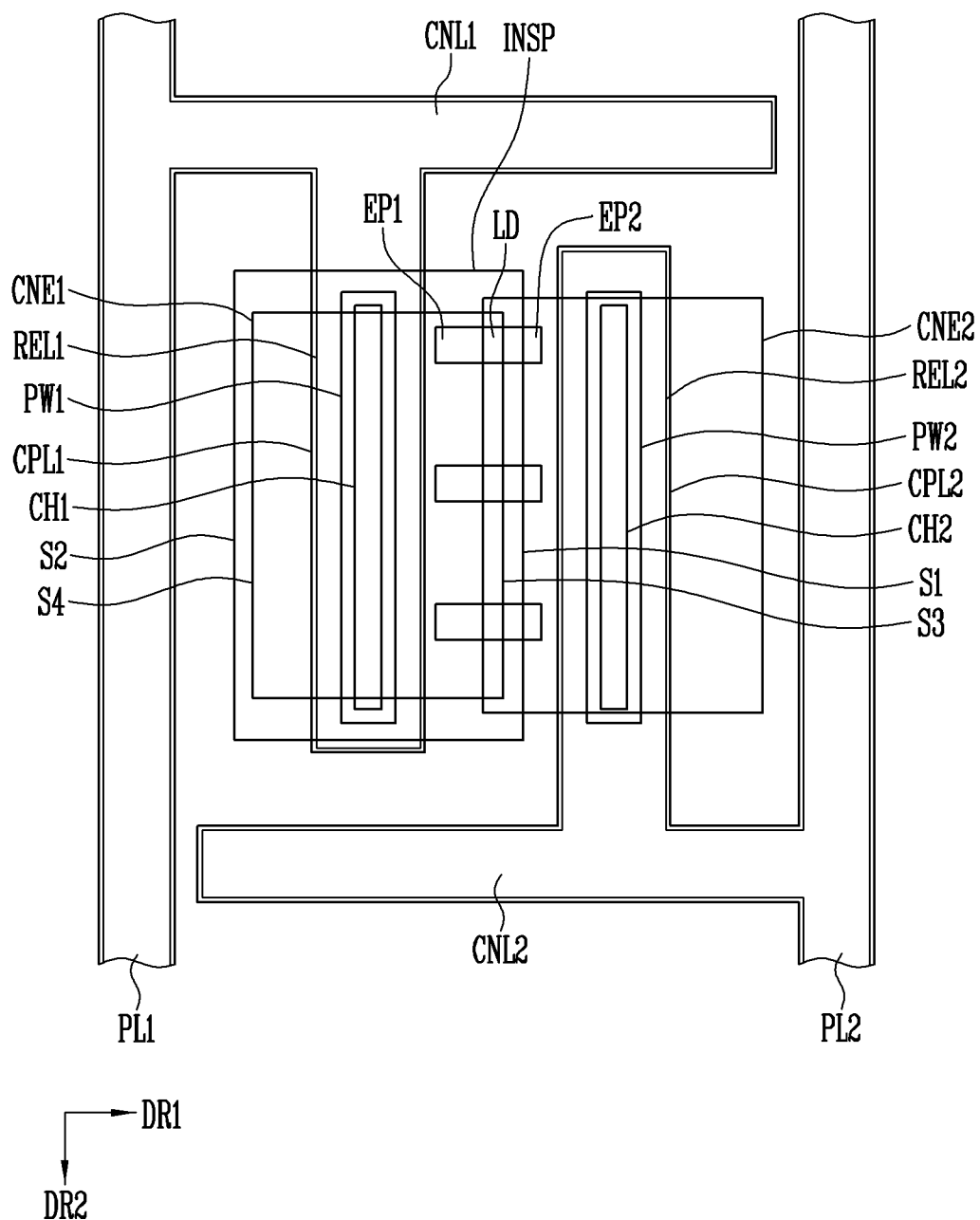

FIG. 3 is a schematic plan view illustrating a unit emission area of the display device. FIGS. 4A and 4B are schematic sectional views taken along line A-A' of FIG. 3. FIG. 5A is a schematic enlarged sectional view of area Q of FIG. 4A. FIGS. 5B and 5C illustrate modification examples Qa and Qb of a structure shown in FIG. 5A.

Although for convenience sake, FIG. 3 illustrates that light emitting elements LD are aligned in a first direction DR1, the alignment of the light emitting elements LD is not limited thereto. For example, the light emitting elements LD may be aligned in an oblique direction between first and second electrodes. As illustrated in FIG. 3, the unit emission area may be a pixel area of one of the sub-pixels included in an emission display panel.

Referring to FIGS. 1A to 5C, the display device in accordance with an embodiment may include a substrate SUB, a barrier layer BRL, first and second partition walls PW1 and PW2, first and second reflective electrodes REL1 and REL2, first and second power lines PL1 and PL2, light emitting elements LD, and first and second contact electrodes CNE1 and CNE2.

The substrate SUB may include an insulating material such as glass, an organic polymer, or crystal. Furthermore, the substrate SUB may be made of a material having flexibility so as to be bendable or foldable, and have a single-layer or multilayer structure.

The barrier layer BRL may be disposed on an overall surface of the substrate SUB to protect the substrate SUB, and may not be disposed depending on embodiments.

The first and second partition walls PW1 and PW2 may be provided on the substrate SUB and define a unit emission area of the display device.

The first and second partition walls PW1 and PW2 may be disposed on the substrate SUB at positions spaced apart from each other by a predetermined distance. For example, the first and second partition walls PW1 and PW2 may be disposed on the substrate SUB at positions spaced apart from each other by a distance equal to or greater than the length of one light emitting element LD.

The first and second partition walls PW1 and PW2 may be formed of an insulating material including an inorganic material or organic material, but the disclosure is not limited thereto.

Each of the first and second partition walls PW1 and PW2 have a trapezoidal shape having side surfaces inclined at a predetermined angle, but the disclosure is not limited to thereto, and it may have various shapes such as a semi-elliptical shape, a circular shape, and a rectangular shape.

The first reflective electrode REL1 (or the first electrode) and the second reflective electrode REL2 (or the second electrode) may be respectively provided on the corresponding partition walls. For example, the first reflective electrode REL1 may be provided on the first partition wall PW1, and the second reflective electrode REL2 may be provided on the second partition wall PW2.

The first and second reflective electrodes REL1 and REL2 may respectively have shapes corresponding to those of the first and second partition walls PW1 and PW2. Therefore, the first reflective electrode REL1 may have a shape corresponding to an inclination of the first partition wall PW1, and the second reflective electrode REL2 may have a shape corresponding to an inclination of the second partition wall PW2.

The first and second reflective electrodes REL1 and REL2 may be provided on the substrate SUB at positions spaced apart from each other with the light emitting element LD interposed therebetween.

In an embodiment, the first reflective electrode REL1 may be disposed adjacent to respective first ends EP1 of the light emitting elements LD, and may be electrically connected to each of the light emitting elements LD through the first contact electrode CNE1. The second reflective electrode REL2 may be disposed adjacent to respective second ends EP2 of the light emitting elements LD, and may be electrically connected to each of the light emitting elements LD through the second contact electrode CNE2.

The first reflective electrode REL1 and the second reflective electrode REL2 may be disposed on the same plane, and have the same height. If the first reflective electrode REL1 and the second reflective electrode REL2 have the same height, the light emitting element LD may be more reliably electrically connected to the first and second reflective electrodes REL1 and REL2.

The first and second reflective electrodes REL1 and REL2 may be formed of conductive materials. The conductive material may include metal, for example, Ag, Mg, Al, Pt, Pd, Au, Ni, Nd, Ir, Cr, Ti, and an alloy thereof.

Furthermore, each of the first and second reflective electrodes REL1 and REL2 may be formed of a single layer, but the disclosure is not limited thereto, and it may be formed of multiple layers.

The materials of the first and second reflective electrodes REL1 and REL2 are not limited to the above-mentioned materials. For example, the first and second reflective electrodes REL1 and REL2 may be made of conductive materials having a predetermined reflectivity to allow light emitted from the opposite ends EP1 and EP2 of the light emitting element LD to travel in a direction (e.g., in a frontal direction) in which an image is displayed.

Since the first and second reflective electrodes REL1 and REL2 have shapes corresponding to the shapes of the first and second partition walls PW1 and PW2, light emitted from the opposite ends EP1 and EP2 of each of the light emitting elements LD may be reflected by the first and second reflective electrodes REL1 and REL2, whereby the light may more effectively travel in the frontal direction. Consequently, the efficiency of light emitted from the light emitting elements LD may be enhanced.

In an embodiment, the first and second partition walls PW1 and PW2, along with the first and second reflective electrodes REL1 and REL2 provided thereon, may function as reflective components for enhancing the efficiency of light emitted from each of the light emitting elements LD.

One of the first and second reflective electrodes REL1 and REL2 may be an anode electrode, and the other reflective electrode may be a cathode electrode. In an embodiment, the first reflective electrode REL1 may be an anode electrode, and the second reflective electrode REL2 may be a cathode electrode.

Although for the sake of explanation, the first and second reflective electrodes REL1 and REL2 are illustrated as being provided directly on the barrier layer BRL (or substrate SUB), the disclosure is not limited thereto. For example, a component for enabling the display device to be driven as a passive matrix or an active matrix may be further provided between barrier layer BRL (or the substrate SUB) and the first and second reflective electrodes REL1 and REL2.

The first reflective electrode REL1 may be electrically connected to the first power line PL1 through a first connection line CNL1. The second reflective electrode REL2 may be electrically connected to the second power line PL2 through a second connection line CNL2.

The first connection line CNL1 may be integrally provided with (or integral with) the first reflective electrode REL1. A second connection line CNL2 may be integral with the second reflective electrode REL2.

The first power line PL1 and the first reflective electrode REL1 may be disposed on the same layer. The second power line PL2 and the second reflective electrode REL2 may be disposed on the same layer. However, the disclosure is not limited thereto.

For example, each of the first and second power lines PL1 and PL2 may be provided on a layer different from that of the corresponding reflective electrode. In this case, each of the first and second power lines PL1 and PL2 may be electrically connected to the corresponding reflective electrode through a contact hole or the like.

In an embodiment, the first and second power lines PL1 and PL2 may be operated as alignment lines for supplying an alignment voltage to the first and second reflective electrodes REL1 and REL2 in case that the light emitting elements LD are aligned on the substrate SUB.

A first capping layer CPL1 may be provided on the first reflective electrode REL1. A second capping layer CPL2 may be provided on the second reflective electrode REL2.

The first and second capping layers CPL1 and CPL2 may respectively prevent the first and second reflective electrodes REL1 and REL2 from being damaged during a process of fabricating the display device.

The first and second capping layers CPL1 and CPL2 may be formed of transparent conductive materials so as to reduce loss of light that is emitted from the light emitting elements LD and reflected by the first and second reflective electrodes REL1 and REL2 in the frontal direction.

The first capping layer CPL1 may be provided directly on the first reflective electrode REL1 and electrically connected to the first reflective electrode REL1. The second capping layer CPL2 may be provided directly on the second reflective electrode REL2 and electrically connected to the second reflective electrode REL2.

A first insulating layer INS1 may be provided on the first and second capping layers CPL1 and CPL2. The first insulating layer INS1 may be provided between the barrier layer BRL (or substrate SUB) and each of the light emitting elements LD.

In an embodiment, the first insulating layer INS1 may include an organic material. The first insulating layer INS1 may fill space between the barrier layer BRL (or substrate SUB) and the light emitting element LD, thereby stably supporting the light emitting element LD.

In an embodiment, the first insulating layer INS1 may include an inorganic insulating layer formed of an inorganic material. In this case, as illustrated in FIG. 4B, a groove GRV may be formed between the first insulating layer INS1 and the light emitting element LD. In an embodiment, an organic layer filling the groove GRV may be further disposed, but the disclosure is not limited thereto.

The first insulating layer INS1 may include a first contact hole CH1 through which a portion of the first capping layer CPL1 is exposed to the outside, and a second contact hole CH2 through which a portion of the second capping layer CPL2 is exposed to the outside.

In an embodiment, if the first and second capping layers CPL1 and CPL2 are omitted, the first insulating layer INS1 may be provided directly on the first and second reflective electrodes REL1 and REL2. In this case, the first contact hole CH1 of the first insulating layer INS1 may expose a portion of the first reflective electrode REL1 to the outside. The second contact hole CH2 of the first insulating layer INS1 may expose a portion of the second reflective electrode REL2 to the outside.

The light emitting elements LD may be provided over the substrate SUB between the first and second reflective electrodes REL1 and REL2. The light emitting elements LD may be induced to be self-aligned by an electric field formed between the first and second reflective electrodes REL1 and REL2. The light emitting elements LD may be provided in the form of a rod extending in the first direction DR1.

The first and second contact electrodes CNE1 and CNE2 may be provided on the first insulating layer INS1 and the light emitting elements LD.

In a plan view, the first contact electrode CNE1 (or a third electrode) may cover (or overlap) the first reflective electrode REL1 and overlap the first reflective electrode REL1.

Furthermore, the first contact electrode CNE1 may partially overlap one of the opposite ends EP1 and EP2 of each of the light emitting elements LD. For example, the first contact electrode CNE1 may partially overlap the first end EP1 of each light emitting element LD.

The first contact electrode CNE1 may be electrically connected to the first capping layer CPL1 through the first contact hole CH1 of the first insulating layer INS1. Since the first capping layer CPL1 is electrically connected to the first reflective electrode REL1, the first contact electrode CNE1 may be electrically connected to the first reflective electrode REL1.

In an embodiment, in case that the first capping layer CPL1 is omitted, the first contact electrode CNE1 may be directly electrically connected to the first reflective electrode REL1 through the first contact hole CH1 of the first insulating layer INS1.

In a plan view, the second contact electrode CNE2 (or a fourth electrode) may cover (or overlap) the second reflective electrode REL2 and overlap the second reflective electrode REL2.

The second contact electrode CNE2 may be electrically connected to the second capping layer CPL2 through the second contact hole CH2 of the first insulating layer INS1. Since the second capping layer CPL2 is electrically connected to the second reflective electrode REL2, the second contact electrode CNE2 may be electrically connected to the second reflective electrode REL2.

In an embodiment, in case that the second capping layer CPL2 is omitted, the second contact electrode CNE2 may be directly electrically connected to the second reflective electrode REL2 through the second contact hole CH2 of the first insulating layer INS1.

Each of the first and second contact electrodes CNE1 and CNE2 may be formed of a transparent conductive material to allow light emitted from each of the light emitting elements LD to travel in the frontal direction without loss. For example, the transparent conductive material may include ITO, IZO, ITZO, etc. The materials of the first and second contact electrodes CNE1 and CNE2 are not limited to the above-mentioned materials.

In an embodiment, the first and second contact electrodes CNE1 and CNE2 may be provided on the same plane.

An insulating pattern INSP may be provided on the first contact electrode CNE1. The insulating pattern INSP may partially overlap the first contact electrode CNE1. The insulating pattern INSP may include an organic insulating layer formed of an organic material in an embodiment, and may include an inorganic insulating layer formed of an inorganic material in an embodiment. The organic material may be polyimide (PI), but the disclosure is not limited thereto. Furthermore, the inorganic material may be one of silicon oxide ($SiO_x$), silicon nitride ($SiN_x$), and silicon oxynitride (SiON), but the disclosure is not limited thereto.

Although the insulating pattern INSP may be provided in a shape extending in a second direction DR2 intersecting the first direction DR1, the disclosure is not limited thereto.

In a plan view, the insulating pattern INSP may include a first side S1 adjacent (e.g., overlapping) to the second contact electrode CNE2, and a second side S2 which is opposite to the first side S1 and is spaced apart from the second contact electrode CNE2.

In a plan view, the first contact electrode CNE1 may include a third side S3 adjacent (e.g., overlapping) to the second contact electrode CNE2, and a fourth side S4 which is opposite to the third side S3 and spaced apart from the second contact electrode CNE2.

The first side S1 of the insulating pattern INSP may be disposed at a position closer to the second contact electrode CNE2 than the third side S3 of the first contact electrode CNE1 is.

The third side S3 of the first contact electrode CNE1 may be provided in an under-cut shape when viewed from the first side S1 of the insulating pattern INSP. As the third side S3 of the first contact electrode CNE1 is provided in an under-cut shape, a void VO may be provided on each of the light emitting elements LD.

As shown in FIG. 5A, the first contact electrode CNE1 may include an under-cut shape, and the first side S1 of the insulating pattern INSP may be formed to be closer to the second contact electrode CNE2 than the third side S3 of the first contact electrode CNE1 is.

A void VO may be provided between the first conductive semiconductor layer 11 (or the insulating film 14) of each of the light emitting element LD and the insulating pattern INSP.

The void VO may be enclosed (or surrounded) and defined by a portion of the first conductive semiconductor layer 11 of each of the light emitting elements LD (or a portion of the insulating film 14), a portion of the first contact electrode CNE1, a portion of the insulating pattern INSP, and a portion of the second contact electrode CNE2.

In an embodiment, as illustrated in FIG. 5B, an insulating pattern INSPa may be formed to cover (or overlap) at least a portion of the third side S3 of the first contact electrode CNE1, and a void VOa may be provided on the first conductive semiconductor layer 11 (or the insulating film 14) of each of the light emitting elements LD.

In an embodiment, as illustrated in FIG. 5C, an insulating pattern INSPb may be formed to cover the entirety of the third side S3 of the first contact electrode CNE1. In this case, unlike in the foregoing embodiment, a void VO may not be provided on the first conductive semiconductor layer 11 (or the insulating film 14). In other words, the insulating pattern INSPb may fill an under-cut shaped portion formed in the first contact electrode CNE1. The insulating pattern INSPb may contact at least a portion of the light emitting element LD.

The insulating patterns INSPa and INSPb illustrated in FIGS. 5B and 5C each may include an organic insulating layer formed of an organic material. A portion of the insulating pattern INSPa, INSPb including the organic insulating layer may reflow by a curing process to be described below and cover at least a portion of a side (e.g., the third side S3) of the first contact electrode CNE1. In other words, by the curing process, the insulating pattern INSPa, INSPb including the organic insulating layer may more effectively prevent a short-circuit failure of the first contact electrode CNE1 and the second contact electrode CNE2 from being caused.

The second contact electrode CNE2 may be electrically separated from the first contact electrode CNE1 by the void VO.

The second contact electrode CNE2 may secure a predetermined level or more of surface area overlapping the insulating pattern INSP within a range in which the second contact electrode CNE2 can be electrically separated from the first contact electrode CNE1.

In an embodiment, in a plan view, the second contact electrode CNE2 may overlap the first contact electrode CNE1 by a predetermined distance and be disposed on the insulating pattern INSP. Hence, the first contact electrode CNE1 and the second contact electrode CNE2 may be electrically separated from each other. In an embodiment, in a sectional view, the second contact electrode CNE2 may be separated from the first contact electrode CNE1 by a predetermined distance and be disposed on the insulating pattern INSP.

A second insulating layer INS2 may be provided on the insulating pattern INSP and the first and second contact electrodes CNE1 and CNE2.

The second insulating layer INS2 may prevent the first and second contact electrodes CNE1 and CNE2 from being exposed to the outside, thereby preventing the first and second contact electrodes CNE1 and CNE2 from being corroded.

The second insulating layer INS2 may include an inorganic insulating layer formed of an inorganic material in an embodiment, and may include an organic insulating layer formed of an organic material in an embodiment. The second insulating layer INS2 may be formed of a single layer structure as shown in the drawing, but the disclosure is not limited thereto, and it may be formed of multiple layers.

An overcoat layer OC may be provided on the second insulating layer INS2.

The overcoat layer OC may be a planarization layer for mitigating a step difference formed by the first and second partition walls PW1 and PW2, the first and second reflective electrodes REL1 and REL2, the first and second contact electrodes CNE1 and CNE2, etc. that are disposed under the overcoat layer OC.

The overcoat layer OC may be an encapsulation layer for preventing oxygen or water from penetrating into the light emitting elements LD.

In some embodiments, the overcoat layer OC may be omitted. In case that the overcoat layer OC is omitted, the second insulating layer INS2 may function as an encapsulation layer for preventing oxygen or water from penetrating into the light emitting elements LD.

Hereinafter, the configuration of the display device according to an embodiment will be described in a stacking sequence with reference to FIGS. 3 to 5A.

The first and second partition walls PW1 and PW2 may be provided on the substrate SUB on which the barrier layer BRL is provided.

The first reflective electrode REL1 may be provided on the first partition wall PW1. The second reflective electrode REL2 may be provided on the second partition wall PW2. The first and second reflective electrodes REL1 and REL2 may be provided on the same plane on the corresponding partition walls, and may have shapes corresponding to the shapes of the corresponding partition walls.

The first capping layer CPL1 may be provided on the first reflective electrode REL1. The second capping layer CPL2 may be provided on the second reflective electrode REL2.

The first insulating layer INS1 may be provided on the substrate SUB on which the first and second capping layers CPL1 and CPL2 are provided. The first insulating layer INS1 may include the first and second contact holes CH1 and CH2.

The light emitting elements LD may be aligned on the first insulating layer INS1 to correspond to space between the first and second reflective electrodes REL1 and REL2.

After a first conductive layer (not shown) and an insulating material layer (or insulating layer) (not shown) are successively applied onto the light emitting elements LD, the first contact electrode CNE1 and the insulating pattern INSP may be formed by an etching process. The third side S3 of the first contact electrode CNE1 may be spaced apart from the first side S1 of the insulating pattern INSP in a direction toward the first reflective electrode REL1 by a predetermined distance by the etching process. Hence, the third side S3 of the first contact electrode CNE1 may have an under-cut shape when viewed from the first side S1 of the insulating pattern INSP.

The second contact electrode CNE2 that overlaps the second reflective electrode REL2 may be provided on the substrate SUB on which the insulating pattern INSP is provided. The second contact electrode CNE2 and the first contact electrode CNE1 may be provided on a same layer and have a same material.

The second insulating layer INS2 may be provided on the first and second contact electrodes CNE1 and CNE2 and the insulating pattern INSP. The overcoat layer OC may be provided on the second insulating layer INS2.

As described above, the second contact electrode CNE2 of the display device in accordance with an embodiment may be electrically separated from the first contact electrode CNE1 by the void VO and the insulating pattern INSP.

In the display device, the first contact electrode CNE1 and the insulating pattern INSP may be disposed over each of the light emitting elements LD so that a valid surface area of each of the first and second contact electrodes CNE1 and CNE2 can be secured. Since the valid surface area (or valid area) of each of the first and second contact electrodes CNE1 and CNE2 is secured, a short circuit between the first and second contact electrode CNE1 and CNE2 may be reduced. Therefore, in the display device in accordance with the embodiment of the disclosure, an occurrence of a contact failure of the light emitting elements LD resulting from the short-circuit failure of the first and second contact electrodes CNE1 and CNE2 may be minimized.

FIGS. 6A to 6F are schematic plan views sequentially illustrating a method of fabricating the display device of FIG. 3. FIGS. 7A to 7K are schematic sectional views sequentially illustrating a method of fabricating the display device illustrated in FIG. 4A.

Referring to FIGS. 3, 4A, 6A, 7A, and 7B, the first and second partition walls PW1 and PW2 extending in the second direction DR2 may be formed on the substrate SUB in each unit emission area. The first and second partition walls PW1 and PW2 may be disposed on the substrate SUB at positions spaced apart from each other by a predetermined distance. In an embodiment, the barrier layer BRL may be further formed on the substrate (SUB) as shown in the drawings.

Thereafter, the first and second reflective electrodes REL1 and REL2, the first and second connection lines CNL1 and CNL2, and the first and second power lines PL1 and PL2 may be formed on the substrate SUB on which the first and second partition walls PW1 and PW2 are provided.

The first reflective electrode REL1 may diverge in the second direction DR2 from the first connection line CNL1 extending in the first direction DR1 intersecting the second direction DR2. The first reflective electrode REL1 may overlap the first partition wall PW1.

The first connection line CNL1 may be electrically connected to the first power line PL1 extending in the second direction DR2.

The first connection line CNL1 may transmit, to the first reflective electrode REL1, an alignment voltage applied to the first power line PL1 in case that the light emitting elements LD are aligned. The first connection line CNL1 may transmit, to the first reflective electrode REL1, a driving voltage applied to the first power line PL1 in case that the light emitting elements LD are driven.

The second reflective electrode REL2 may diverge in the second direction DR2 from the second connection line CNL2 extending in the first direction DR1. The second reflective electrode REL2 may overlap the second partition wall PW2.

The second connection line CNL2 may be electrically connected to the second power line PL2 extending in the second direction DR2.

The second connection line CNL2 may transmit, to the second reflective electrode REL2, an alignment voltage applied to the second power line PL2 in case that the light emitting elements LD are aligned. The second connection line CNL2 may transmit, to the second reflective electrode REL2, a driving voltage applied to the second power line PL2 in case that the light emitting elements LD are driven.

In an embodiment, the first and second reflective electrodes REL1 and REL2, the first and second connection lines CNL1 and CNL2, and the first and second power lines PL1 and PL2 may be provided on a same plane.

Furthermore, the first and second reflective electrodes REL1 and REL2, the first and second connection lines CNL1 and CNL2, and the first and second power lines PL1 and PL2 may have a same material. For example, the first and second reflective electrodes REL1 and REL2, the first and second connection lines CNL1 and CNL2, and the first and second power lines PL1 and PL2 may have a conductive material having a predetermined reflectivity.

Referring to FIGS. 3, 4A, 6B, and 7A to 7C, the first and second capping layers CPL1 and CPL2 may be formed on the substrate SUB on which the first and second reflective electrodes REL1 and REL2, etc. are provided.

The first and second capping layers CPL1 and CPL2 may include the same material. For example, the first and second capping layers CPL1 and CPL2 may include a transparent conductive material.

In a plan view, the first capping layer CPL1 may overlap the first reflective electrode REL1 and the first connection line CNL1, and the second capping layer CPL2 may overlap the second reflective electrode REL2 and the second connection line CNL2.

Referring to FIGS. 3, 4A, 6C, and 7A to 7E, a first insulating material layer INS1' may be formed on the substrate SUB on which the first and second capping layers CPL1 and CPL2 are provided, and, thereafter, the first insulating layer INS1 including the first contact hole CH1 and the second contact hole CH2 which expose respective portions of the first and second capping layers CPL1 and CPL2 may be formed by patterning the first insulating material layer INS1' by a mask process.

Referring to FIGS. 3, 4A, 6D, and 7A to 7F, an electric field may be formed between the first and second reflective electrodes REL1 and REL2 by respectively applying alignment voltages to the first and second reflective electrodes REL1 and REL2 through the first and second power lines PL1 and PL2.

While the electric field is formed between the first and second reflective electrodes REL1 and REL2, the light emitting elements LD may be input onto the substrate SUB by an inkjet printing method or the like.

If the light emitting elements LD are input onto the substrate SUB, self-alignment of the light emitting elements LD may be induced by the electric field formed between the first reflective electrode REL1 and the second reflective electrode REL2. Consequently, the light emitting elements LD may be aligned between the first and second reflective electrodes REL1 and REL2.

Referring to FIGS. 3, 4A, and 7A to 7G, a conductive material layer CNE1' and a second insulating material layer INSP' may be sequentially formed on the substrate SUB on which the light emitting elements LD are aligned.

The conductive material layer CNE1' may be formed of a transparent conductive material so as to minimize loss of light emitted from each of the light emitting elements LD.

The second insulating material layer INSP' may be provided on the conductive material layer CNE1' and include an inorganic insulating layer formed of an inorganic material. The disclosure is not limited thereto. In an embodiment, the second insulating material layer INSP' may include an organic insulating layer formed of an organic material.

Referring to FIGS. 3, 4A, 5A to 5B, 6E, and 7A to 7H, the first contact electrode CNE1 and the insulating pattern INSP may be formed by simultaneously patterning the conductive material layer CNE1' and the second insulating material layer INSP' by successively performing first and second etching processes.

In an embodiment, the first etching process may include a dry etching process, and the second etching process may include a wet etching process.

First, the first etching process is performed so that the insulating pattern INSP and a conductive pattern (not illustrated) may be formed by patterning the second insulating material layer INSP' and the conductive material layer CNE1' such that a portion of the first insulating layer INS1 and a portion of each light emitting element LD are exposed to the outside.

Although not directly illustrated in the drawings, a side of the insulating pattern INSP and a side of the conductive pattern patterned by the first etching process may correspond to each other.

The second etching process may be performed using the insulating pattern INSP as an etching mask. A solvent capable of etching the conductive pattern, disposed under the insulating pattern INSP may be used as an etchant to be employed during the second etching process.

By the second etching process, the conductive pattern may form an under-cut shape under the first side S1 of the insulating pattern INSP and become the first contact electrode CNE1 having the third side S3 spaced apart from the first side S1 of the insulating pattern INSP inward.

In a plan view, the third side S3 of the first contact electrode CNE1 may be spaced apart from the second reflective electrode REL2 by a predetermined distance.

Furthermore, the first contact electrode CNE1 may overlap a remaining portion of each light emitting element LD other than the exposed portion thereof. The first contact electrode CNE1 may be electrically connected to an end of each of the light emitting elements LD.

Referring to FIGS. 3, 4A, 6F, and 7A to 7I, the second contact electrode CNE2 may be formed by performing a mask process after the second conductive layer (not illustrated) is formed on the substrate SUB on which the insulating pattern INSP is provided.

The first and second contact electrodes CNE1 and CNE2 may be provided on the same plane and spaced apart from each other by a predetermined distance to be electrically separated from each other in the sectional view.

The first contact electrode CNE1 may be disposed on a portion of the first insulating layer INS1 including the first contact hole CH1.

The first contact electrode CNE1 may be electrically connected to the first capping layer CPL1 through the first contact hole CH1. Furthermore, the first contact electrode CNE1 may be electrically connected to an end of each light emitting element LD.

The second contact electrode CNE2 may be disposed on a portion of the insulating pattern INSP and a portion of the first insulating layer INS1 including the second contact hole CH2.

The second contact electrode CNE2 may be electrically connected to the second capping layer CPL2 through the second contact hole CH2. Furthermore, the second contact electrode CNE2 may be electrically connected to the other end of each light emitting element LD.

Figure 7A:
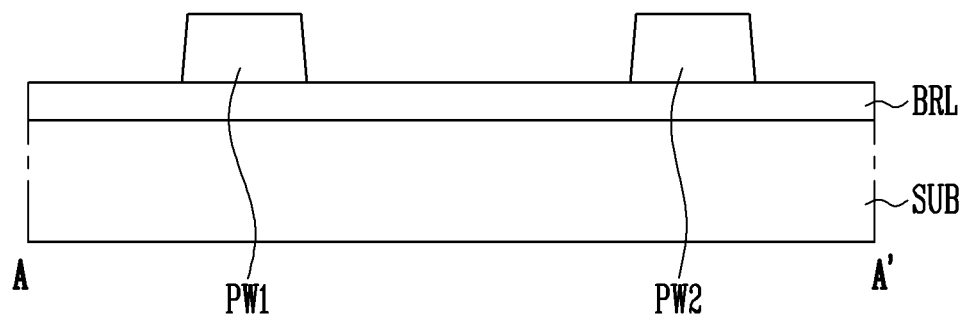
FIGS. 7A to 7K are cross-sectional views schematically and sequentially illustrating a method of fabricating the display device illustrated in FIG. 4A.
Figure 7B:
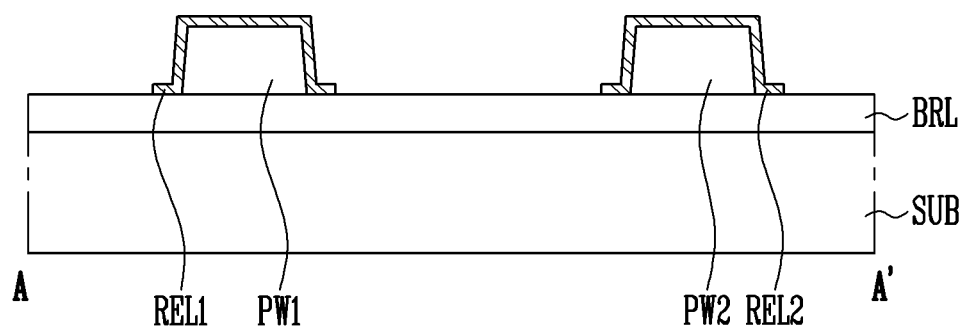
Figure 7C:
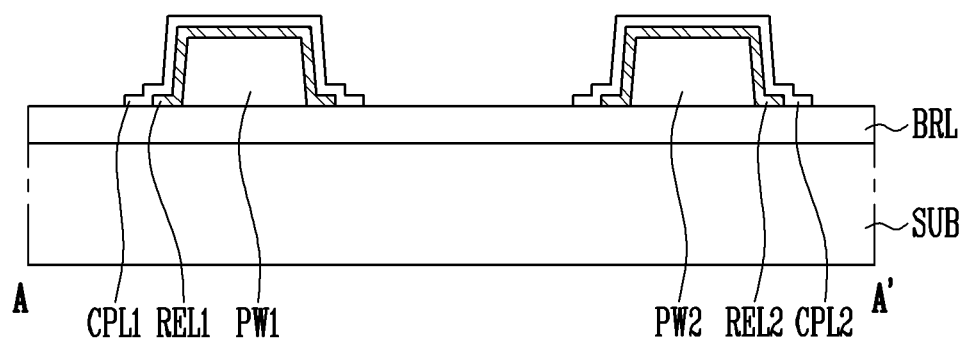
Figure 7D:
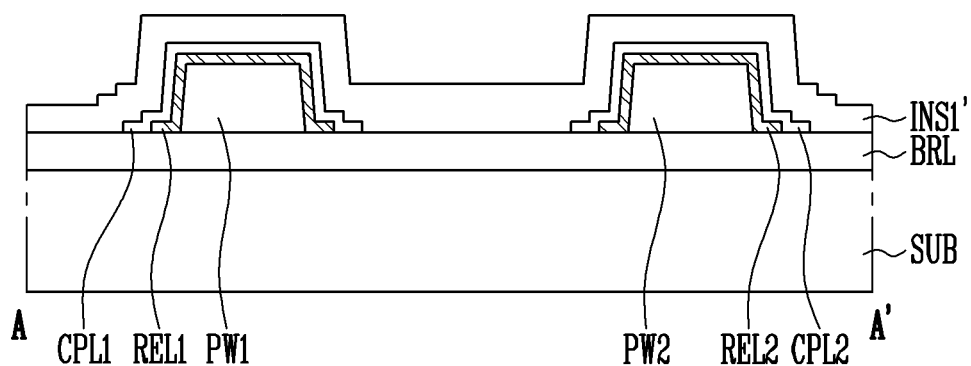
Figure 7E:
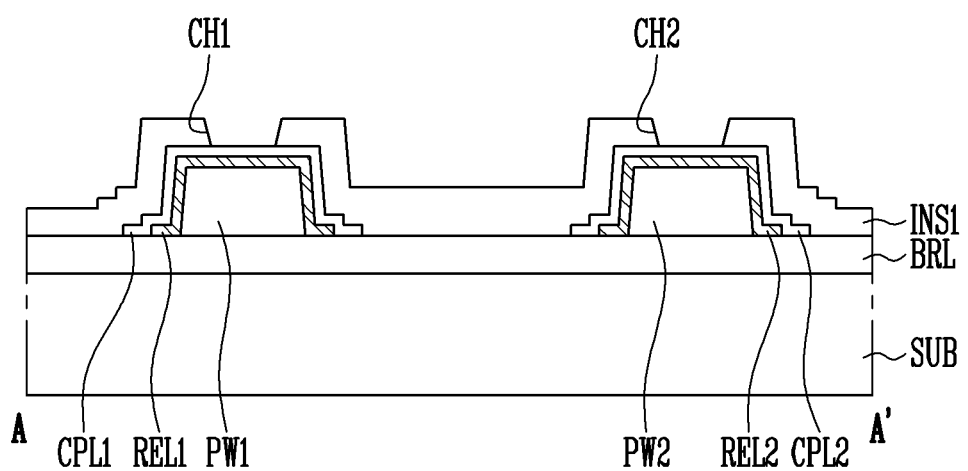
Figure 7F:
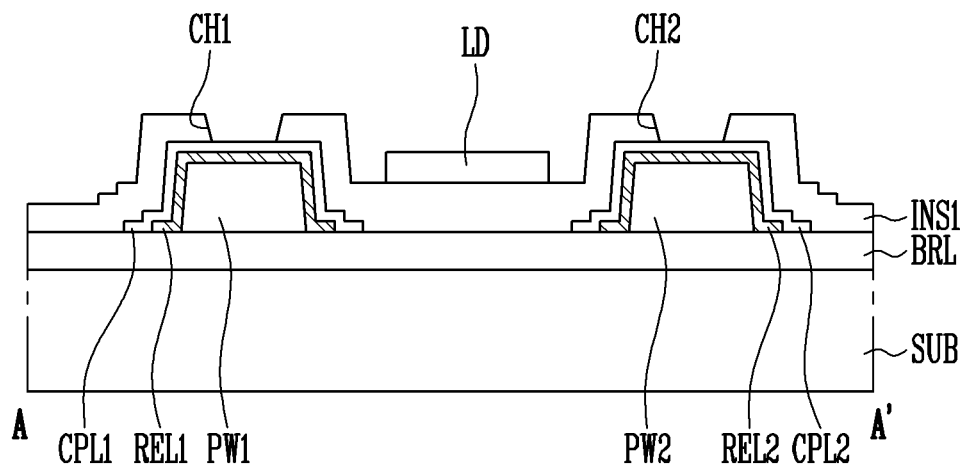
Figure 7G:
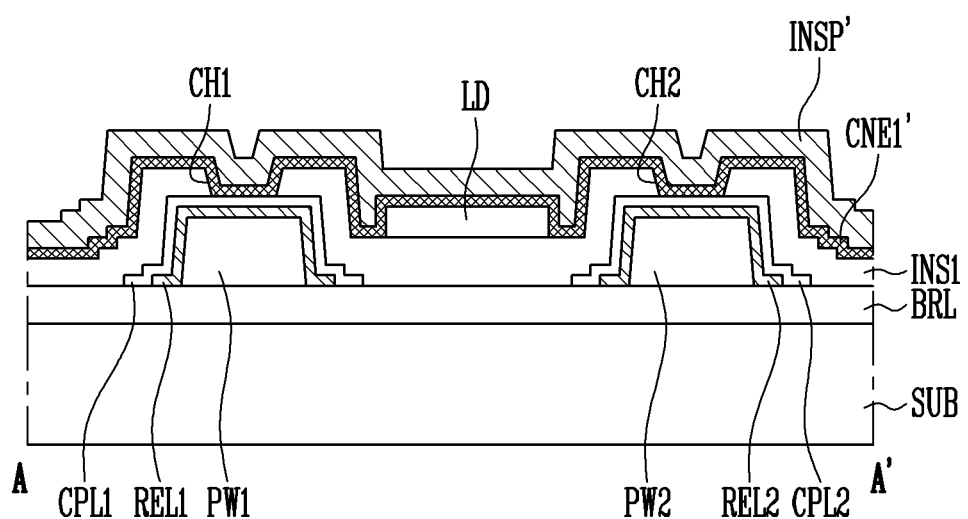
Figure 7H:
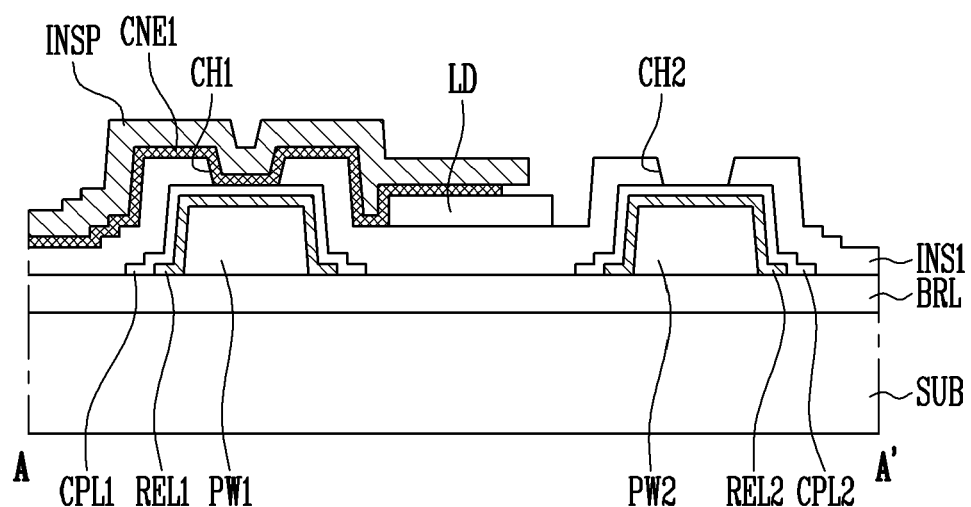
Figure 7I:
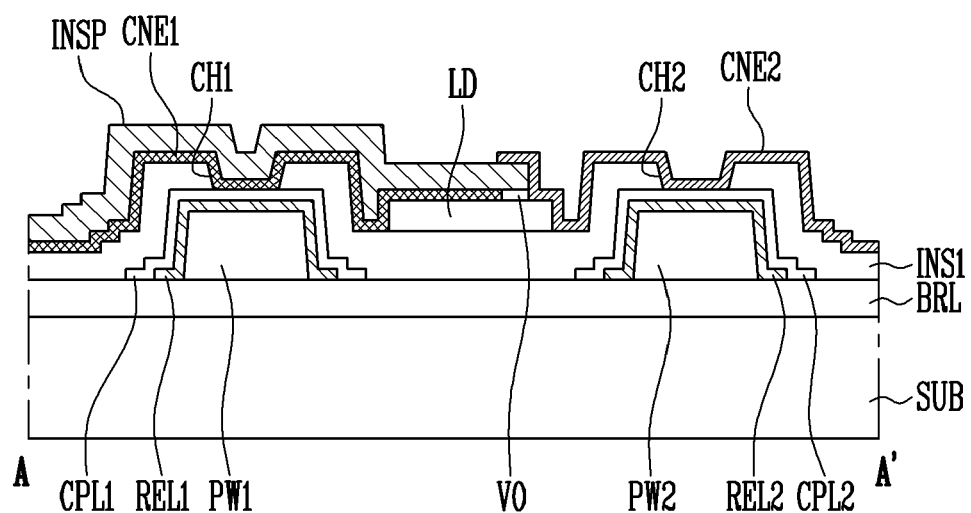
Figure 7J:
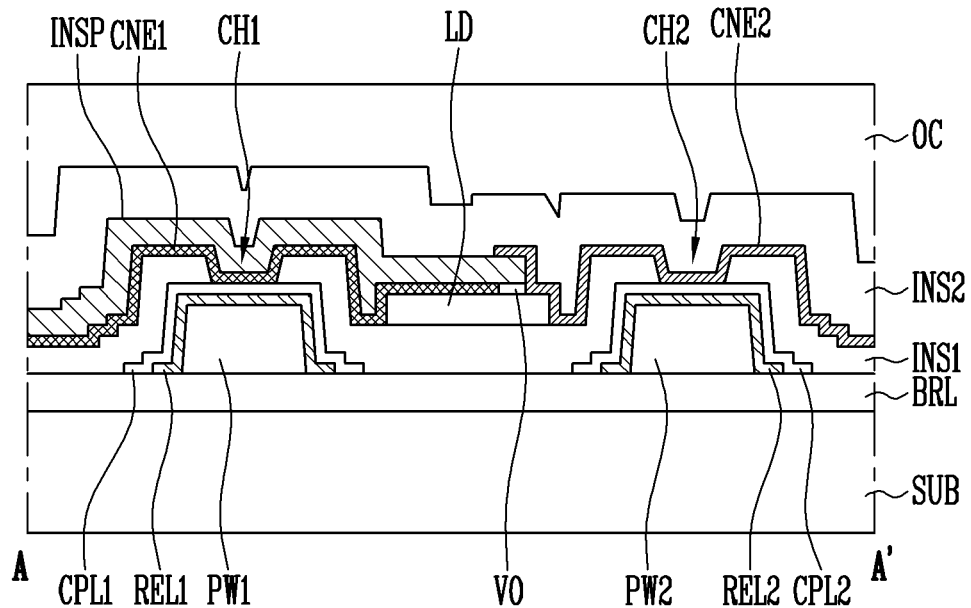

Referring to FIGS. 3, 4A, and 7J, the second insulating layer INS2 may be formed on the first and second contact electrodes CNE1 and CNE2. Subsequently, the overcoat layer OC may be formed on the second insulating layer INS2.

Figure 7K:
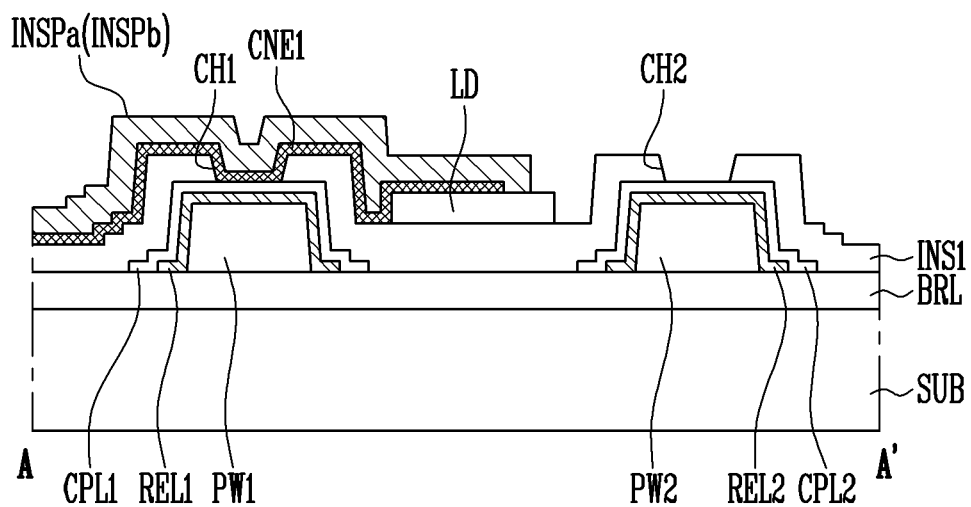

Referring further to FIG. 7K, in case that the insulating pattern INSP includes an organic insulating layer formed of an organic material, a curing process may be further performed before the second contact electrode CNE2 is formed after the first contact electrode CNE1 and the insulating pattern INSP are formed by performing the first etching process and the second etching process.

The curing process may be a process of hardening and stabilizing the insulating pattern INSP. For example, the curing process may be a process of applying heat of a predetermined temperature or more to the insulating pattern INSP for a predetermined time or more.

In an embodiment, the shape of the insulating pattern INSP may be changed by the curing process. In detail, due to the curing process, the insulating pattern INSP may reflow. As the insulating pattern INSP reflows, the shape of at least a portion of the insulating pattern INSP may change.

As described above with reference to FIGS. 5B and 5C, the insulating pattern INSPa, INSPb may be formed to cover (or overlap) a portion or the entirety of a side of the first contact electrode CNE1, and a void VOa or no void may be provided on the light emitting elements LD. In other words, the insulating pattern INSPa, INSPb may reflow to cover the under-cut shaped portion formed in the first contact electrode CNE1.

In other words, by the curing process, the insulating pattern INSPa, INSPb including the organic insulating layer may more effectively prevent a short-circuit failure of the first contact electrode CNE1 and the second contact electrode CNE2 from being caused.

Figure 8:
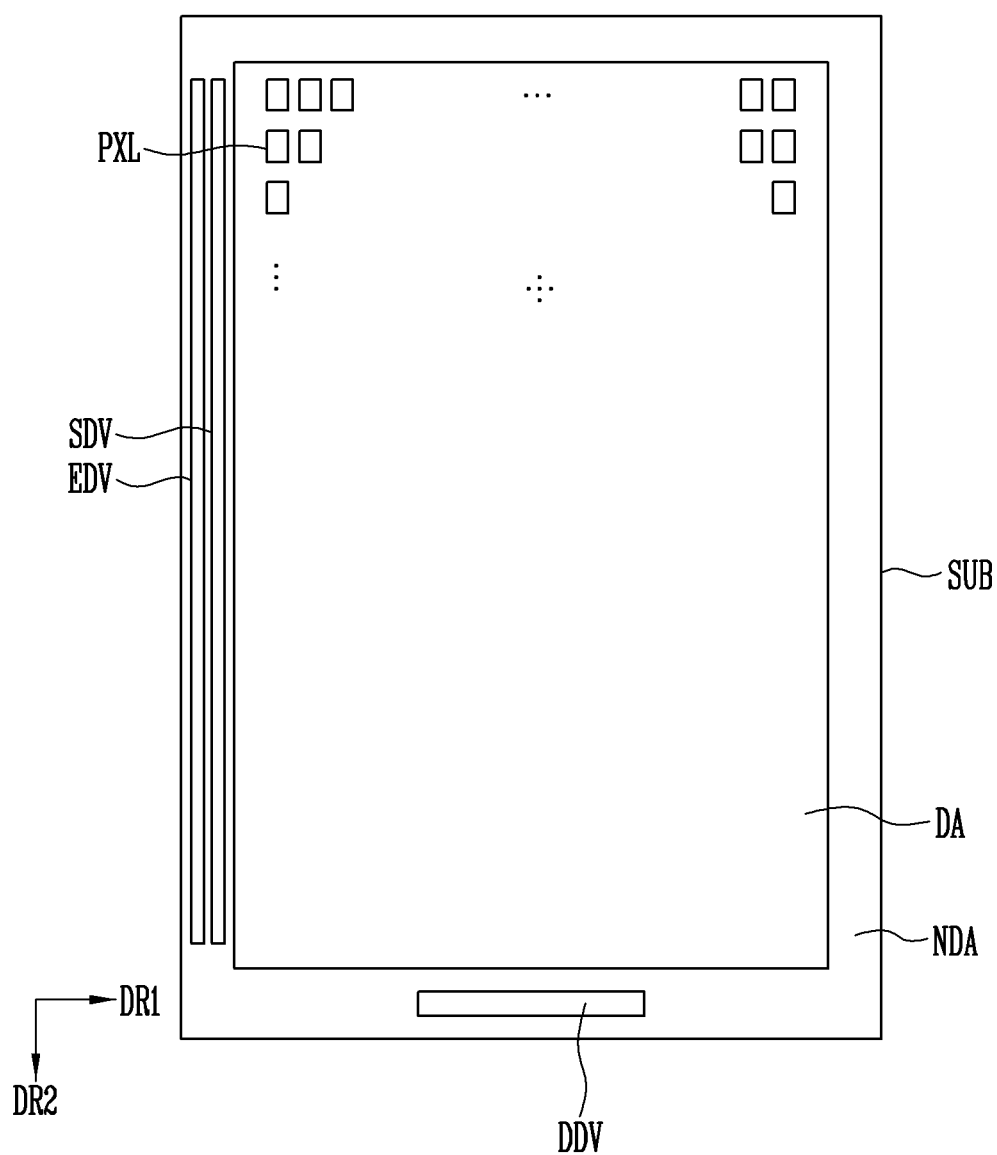
FIG. 8 is a plan view schematically illustrating a display device in accordance with an embodiment of the disclosure.

FIG. 8 is a plan view schematically illustrating a display device in accordance with an embodiment of the disclosure.

Referring to FIGS. 1A and 8, the display device in accordance with the embodiment of the disclosure includes a substrate SUB, pixels PXL provided on the substrate SUB, a driver provided on the substrate SUB and configured to drive the pixels PXL, and a line component (not illustrated) provided to electrically connect the pixels PXL with the driver.

The substrate SUB may include a display area DA and a non-display area NDA.

The display area DA may be an area in which the pixels PXL for displaying an image are provided. The non-display area NDA may be an area in which the driver for driving the pixels PXL and a part of the line component for electrically connecting the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semiellipse or the like including sides formed of a linear line and a curved line.

In case that the display area DA includes areas, each area may also be provided in various forms such as a closed polygon including linear sides, and a semicircle, a semiellipse or the like including sides formed of a curved line. The surface areas of the areas may be the same as or different from each other.

In an embodiment, there will be described an example in which the display area DA is provided as a single area having a rectangular shape including linear sides.

The non-display area NDA may be provided on at least one side of the display area DA. In an embodiment, the non-display area NDA may enclose the periphery of the display area DA.

The pixels PXL may be provided in the display area DA on the substrate SUB. Each of the pixels PXL refers to a smallest unit for displaying an image, and pixels PXL may be provided.

Each of the pixels PXL may include at least one light emitting elements LD which emit white light and/or color light. Each pixel PXL may emit light having any color among red, green, and blue, but the disclosure is not limited thereto. For example, each of the pixels PXL may emit light having any color among cyan, magenta, yellow, and white.

The pixels PXL may be arranged in a matrix form along rows extending in a first direction DR1 and columns extending in a second direction DR2 intersecting the first direction DR1. However, the arrangement of the pixels PXL is not limited to a particular arrangement. In other words, the pixels PXL may be arranged in various forms.

The driver may provide a signal to each pixel PXL through the line component and thus control the operation of the pixel PXL. In FIG. 8, for the sake of explanation, the line component is omitted.

The driver may include a scan driver SDV configured to provide scan signals to the pixels PXL through scan lines, an emission driver EDV configured to provide emission control signals to the pixels PXL through emission control lines, a data driver DDV configured to provide data signals to the pixels PXL through data lines, and a timing controller (not illustrated). The timing controller may control the scan driver SDV, the emission driver EDV, and the data driver DDV.

Figure 9:
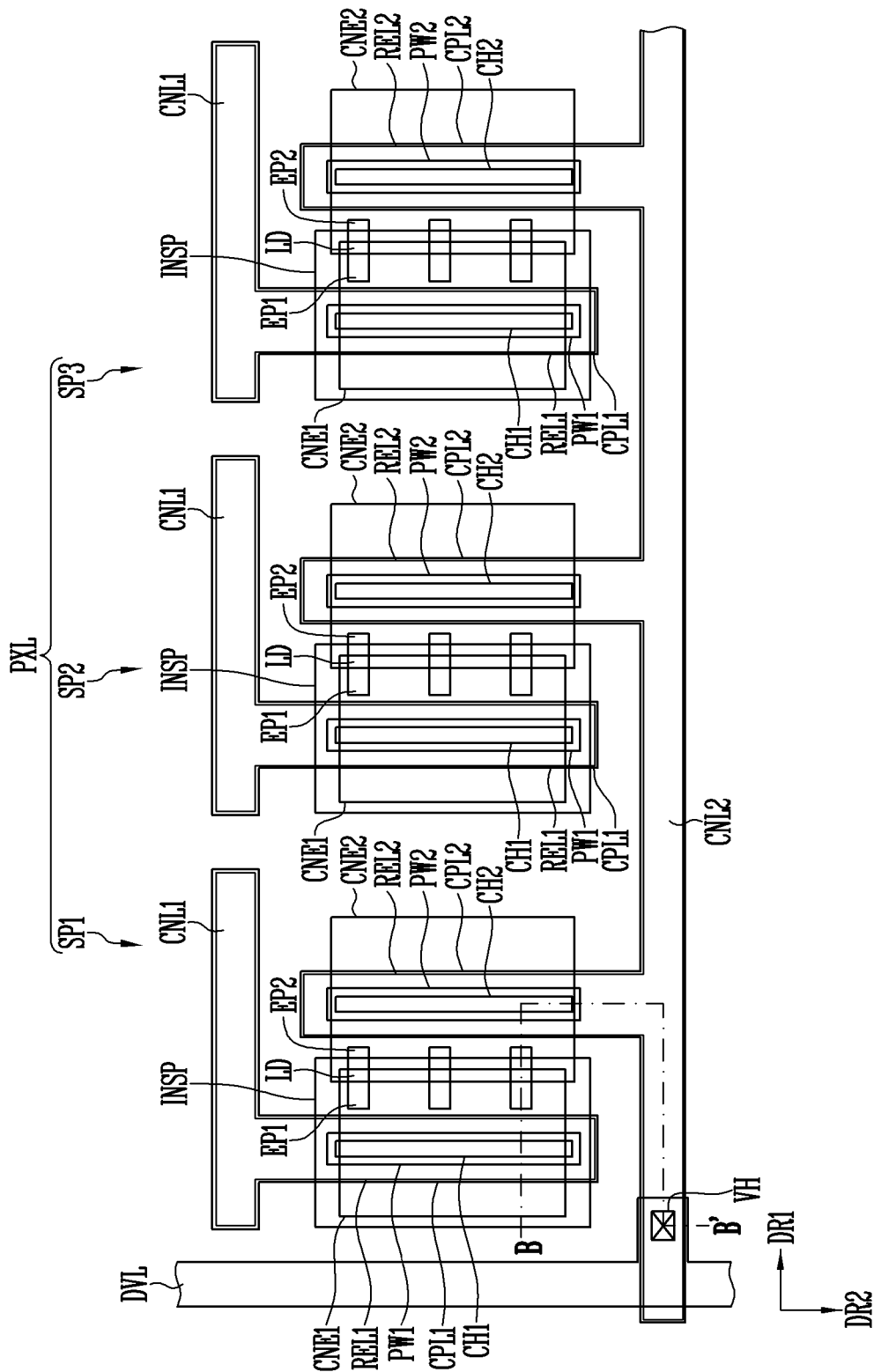
FIG. 9 is a plan view schematically illustrating first to third sub-pixels included in one pixel of the pixels illustrated in FIG. 8.
Figure 10:
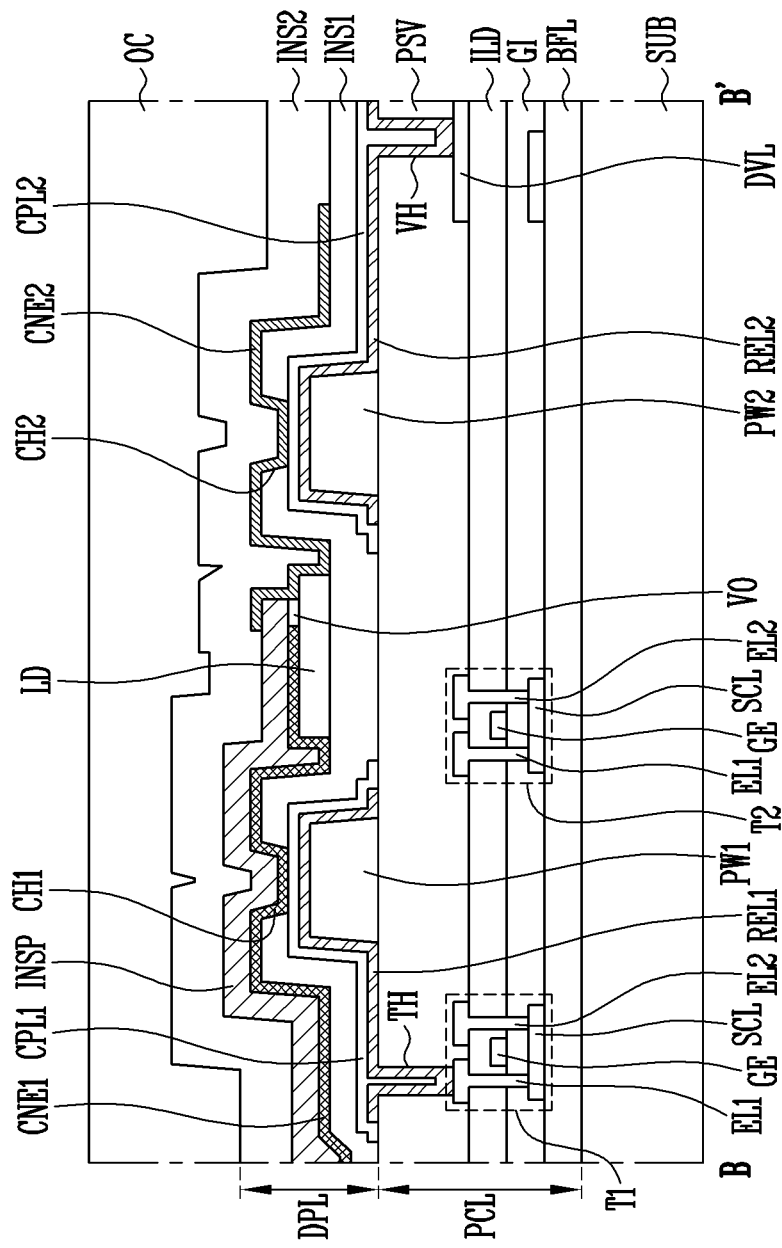
FIG. 10 is a schematic cross-sectional view taken along line B-B' of FIG. 9.

FIG. 9 is a plan view schematically illustrating first to third sub-pixels included in a pixel illustrated in FIG. 8. FIG. 10 is a schematic sectional view taken along line B-B' of FIG. 9. In an embodiment, the following description will be focused on differences from the foregoing embodiments to avoid repetitive descriptions. Components which are not separately explained in the following description comply with those of the foregoing embodiments. The same reference numeral will be used to designate the same component, and a similar reference numeral will be used to designate a similar component.

For the sake of explanation, transistors electrically connected to the light emitting elements, and signal lines electrically connected to the transistors are omitted from FIG. 9. As illustrated in FIG. 9, the unit emission area may be a pixel area of a sub-pixel.

Referring to FIGS. 8 to 10, the display device in accordance with an embodiment may include a substrate SUB on which pixels PXL are provided.

Each of the pixels PXL may include a first sub-pixel SP1, a second sub-pixel SP2, and a third sub-pixel SP3 which are provided on the substrate SUB.

Each of the first to third sub-pixels SP1, SP2, and SP3 may include the substrate SUB, a pixel circuit layer PCL provided on the substrate SUB, and a display element layer DPL provided on the pixel circuit layer PCL.

The pixel circuit layer PCL may include a buffer layer BFL disposed on the substrate SUB, first and second transistors T1 and T2 disposed on the buffer layer BFL, and a driving voltage line DVL. Furthermore, the pixel circuit layer PCL may further include a passivation layer PSV which is provided on the first and second transistors T1 and T2 and the driving voltage line DVL.

The display element layer DPL may include first and second partition walls PW1 and PW2, first and second reflective electrodes REL1 and REL2, first and second connection lines CNL1 and CNL2, light emitting elements LD, and first and second contact electrodes CNE1 and CNE2 which are provided on the passivation layer PSV.

For convenience sake, the display element layer DPL will be described after the pixel circuit layer PCL is described.

The buffer layer BFL may be provided on the substrate SUB and prevent impurities from diffusing into the first and second transistors T1 and T2. The buffer layer BFL may be provided in a single-layer structure or a multilayer structure having at least two layers.

In case that the buffer layer BFL has a multilayer structure, respective layers may be formed of the same material or different materials. The buffer layer BFL may be omitted depending on the material of the substrate SUB or processing conditions.

The first transistor T1 may be a driving transistor which is electrically connected to some of the light emitting elements LD provided in the display element layer DPL to drive the corresponding light emitting element LD. The second transistor T2 may be a switching transistor configured to switch the first transistor T1.

Each of the first and second transistors T1 and T2 may include a semiconductor layer SCL, a gate electrode GE, and first and second transistor electrodes EL1 and EL2.

The semiconductor layer SCL may be disposed on the buffer layer BFL. The semiconductor layer SCL may include a first area contacting the first transistor electrode EL1, and a second area contacting the second transistor electrode EL2. An area between the first area and the second area may be a channel area. In an embodiment, the first area may be any of a source area and a drain area, and the second area may be the other area.

The semiconductor layer SCL may be a semiconductor pattern formed of polysilicon, amorphous silicon, an oxide semiconductor, etc. The channel area may be an intrinsic semiconductor, which is an undoped semiconductor pattern. Each of the first area and the second area may be a semiconductor pattern doped with impurities.

The gate electrode GE may be provided on the semiconductor layer SCL with a gate insulating layer GI interposed therebetween. An interlayer insulating layer ILD may be provided on the gate insulating layer GI.

The first transistor electrode EL1 and the second transistor electrode EL2 may respectively contact the first area and the second area of the semiconductor layer SCL through contact holes which pass through an interlayer insulating layer ILD and the gate insulating layer GI.

The driving voltage line DVL may be provided on the interlayer insulating layer ILD, but the disclosure is not limited thereto. In some embodiments, the driving voltage line DVL may be provided on one of insulating layers included in the pixel circuit layer PCL. The second driving power supply VSS may be applied to the driving voltage line DVL.

The passivation layer PSV may include a through hole TH through which the first transistor electrode EL1 of the first transistor T1 is exposed, and a via hole VH through which the driving voltage line DVL is exposed.

The first and second partition walls PW1 and PW2 may be disposed on the passivation layer PSV at positions spaced apart from each other by a predetermined distance. Each of the first and second partition walls PW1 and PW2 may be provided in a trapezoidal shape having sides inclined at a predetermined angle, but the disclosure is not limited thereto.

The first reflective electrode REL1 may be provided on the first partition wall PW1. The second reflective electrode REL2 may be provided on the second partition wall PW2. Therefore, the first reflective electrode REL1 may have a shape corresponding to that of the first partition wall PW1, and the second reflective electrode REL2 may have a shape corresponding to that of the second partition wall PW2.

The first reflective electrode REL1 may diverge from the first connection line CNL1 extending in a first direction DR1, in a second direction DR2 intersecting the first direction DR1. The second reflective electrode REL2 may diverge in the second direction DR2 from the second connection line CNL2 extending in the first direction DR1.

The first connection line CNL1 provided in the first sub-pixel SP1 may be electrically separated from the first connection line CNL1 provided in the second sub-pixel SP2 disposed adjacent to the first sub-pixel SP1. Furthermore, the first connection line CNL1 provided in the second sub-pixel SP2 may be electrically separated from the first connection line CNL1 provided in the third sub-pixel SP3 disposed adjacent to the second sub-pixel SP2.

Hence, the first connection line CNL1 provided in one (or first) sub-pixel may be electrically separated from the first connection line CNL1 provided in a sub-pixel disposed adjacent to the one sub-pixel. Thus, each of the first to third sub-pixels SP1 to SP3 may be individually driven.

The second connection line CNL2 provided in the first sub-pixel SP1 may be provided in common in the second and third sub-pixels SP2 and SP3 disposed adjacent to the first sub-pixel SP1.

In a plan view, the first and second reflective electrodes REL1 and REL2 may be spaced apart from each other by a predetermined distance with the light emitting elements LD provided therebetween. The first reflective electrode REL1 may be disposed adjacent to any of the opposite ends EP1 and EP2 of each light emitting element LD. The second reflective electrode REL2 may be disposed adjacent to the other of the opposite ends EP1 and EP2 of the light emitting element LD.

The first and second reflective electrodes REL1 and REL2 may be provided on the same plane.

The first reflective electrode REL1 may be electrically connected to the first transistor electrode EL1 of the first transistor T1 through the through hole TH of the passivation layer PSV. Hence, a voltage applied to the first transistor T1 may be transmitted to the first reflective electrode REL1.

The second reflective electrode REL2 may be electrically connected with the driving voltage line DVL through the via hole VH of the passivation layer PSV.

A first capping layer CPL1 may be provided on the first reflective electrode REL1. A second capping layer CPL2 may be provided on the second reflective electrode REL2.

A first insulating layer INS1 may be provided on the first and second capping layers CPL1 and CPL2. The first insulating layer INS1 may include an inorganic insulating layer or an organic insulating layer.

The first insulating layer INS1 may include a first contact hole CH1 through which a portion of the first capping layer CPL1 is exposed, and a second contact hole CH2 through which a portion of the second capping layer CPL2 is exposed.

Each of the light emitting elements LD may be provided on the first insulating layer INS1 and aligned between the first and second reflective electrodes REL1 and REL2.

Each of the light emitting elements LD may include first and second ends EP1 and EP2 in the longitudinal direction.

The first contact electrode CNE1 may be provided on the first reflective electrode REL1 to electrically and/or physically reliably connect the first reflective electrode REL1 with the first end EP1 of each light emitting element LD.

An insulating pattern INSP may be provided on the first contact electrode CNE1. The insulating pattern INSP may cover (or overlap) the first contact electrode CNE1 to prevent the first contact electrode CNE1 from being exposed to the outside and electrically separate the first contact electrode CNE1 from the second contact electrode CNE2.

The second contact electrode CNE2 may be provided on the second reflective electrode REL2 to electrically connect the second reflective electrode REL2 with the second end EP2 of each light emitting element LD.

A void VO may be formed between the light emitting elements LD and the insulating pattern INSP.

The void VO may be enclosed and defined by a portion of each of the light emitting elements LD, a portion of the first contact electrode CNE1, a portion of the insulating pattern INSP, and a portion of the second contact electrode CNE2.

In each of the first to third sub-pixels SP1 to SP3, the first contact electrode CNE1 may be spaced apart from the second reflective electrode REL2 and partially overlap the first reflective electrode REL1 in a plan view.

The first contact electrode CNE1 may be electrically connected to the first end EP1 of each light emitting element LD.

In case that an electric field having a predetermined voltage or more is applied to each light emitting element LD, each light emitting element LD may emit light.

A second insulating layer INS2 may be provided on the first and second contact electrodes CNE1 and CNE2. The second insulating layer INS2 may cover the first and second contact electrodes CNE1 and CNE2 disposed under the second insulating layer INS2 so that the first and second contact electrodes CNE1 and CNE2 can be prevented from being exposed to the outside.

An overcoat layer OC may be provided on the second insulating layer INS2.

As described above, the second contact electrode CNE2 of the display device in accordance with an embodiment of the disclosure may be electrically separated from the first contact electrode CNE1 by the void VO and the insulating pattern INSP.

In other words, in the display device in accordance with an embodiment, a sufficient amount of valid surface area of the first contact electrode CNE1 electrically connected to the first end EP1 of each light emitting element LD and a sufficient amount of a valid area of the second contact electrode CNE2 electrically connected to the second end EP2 of each light emitting element LD may be secured.

Since the valid area of each of the first and second contact electrodes CNE1 and CNE2 is secured, an occurrence of a short-circuit failure of the first and second contact electrodes CNE1 and CNE2 may be reduced. Therefore, in the display device in accordance with an embodiment of the disclosure, occurrence of a contact failure of the light emitting elements LD resulting from the short-circuit failure of the first and second contact electrodes CNE1 and CNE2 may be minimized.

The display device in accordance with an embodiment may be employed in various electronic devices. For instance, the display device may be applied to a television, a laptop computer, a cellular phone, a smartphone, a smartpad, a portable multimedia player (PMP), a personal digital assistant (PDA), a navigation device, various kinds of wearable devices such as a smartwatch, etc.

While various embodiments have been described above, those skilled in the art will appreciate that various modifications, additions and substitutions are possible, without departing from the scope and spirit of the disclosure. Therefore, the embodiments disclosed in this specification are only for illustrative purposes rather than limiting the technical spirit of the disclosure. The scope of the disclosure must be defined by the accompanying claims.

What is claimed is:

1. A display device comprising:
   a first electrode and a second electrode disposed on a substrate and spaced apart from each other;
   a light emitting element disposed on the substrate and having a first end and a second end;
   a third electrode disposed on the light emitting element and electrically connecting the first electrode with the first end of the light emitting element;
   an insulating pattern disposed on the third electrode and exposing the second end of the light emitting element; and
   a fourth electrode disposed on the substrate and electrically connecting the second electrode with the second end of the light emitting element,
   wherein a void devoid of solid material is formed between the light emitting element and the insulating pattern.

2. The display device according to claim 1, wherein
   the insulating pattern includes a first side overlapping the light emitting element and disposed adjacent to the second electrode,
   the third electrode includes a second side overlapping the light emitting element and disposed adjacent to the second electrode, and
   the second side is closer to the first electrode than the first side is, in a plan view.

3. The display device according to claim 2, wherein the void is surrounded by a portion of the light emitting element, a portion of the third electrode, a portion of the insulating pattern, and a portion of the fourth electrode.

4. The display device according to claim 3, wherein
   the insulating pattern includes an organic insulating layer including an organic material, and
   the insulating pattern overlaps at least a portion of the second side of the third electrode.

5. The display device according to claim 3, wherein
   the insulating pattern includes an inorganic insulating layer including at least one of silicon oxide, silicon nitride, and silicon oxynitride, and
   the insulating pattern does not overlap the second side of the third electrode.

6. The display device according to claim 1, further comprising:
   an insulating layer disposed on the first electrode and the second electrode,
   wherein the insulating layer includes:
      a first contact hole through which a portion of the first electrode is exposed; and
      a second contact hole through which a portion of the second electrode is exposed.

7. The display device according to claim 6, wherein
   the third electrode is electrically connected to the first electrode through the first contact hole,
   the fourth electrode is electrically connected to the second electrode through the second contact hole, and
   the third electrode and the fourth electrode are electrically disconnected from each other.

8. The display device according to claim 6, wherein
   the insulating layer includes an inorganic insulating layer including an inorganic material, and
   a groove is formed between the insulating layer and the light emitting element.

9. A display device comprising:
   a first electrode and a second electrode disposed on a substrate and spaced apart from each other;
   a light emitting element disposed on the substrate and having a first end and a second end;
   a third electrode disposed on and over the light emitting element, the third electrode electrically connecting the first electrode with the first end of the light emitting element;
   an insulating pattern disposed on the third electrode, the insulating pattern exposing and not overlapping the second end of the light emitting element; and
   a fourth electrode disposed on the substrate and electrically connecting the second electrode with the second end of the light emitting element,
   wherein at least a portion of the insulating pattern contacts the light emitting element.

10. The display device according to claim 9, wherein
    the insulating pattern includes a first side overlapping the light emitting element and disposed adjacent to the second electrode,
    the third electrode includes a second side overlapping the light emitting element and disposed adjacent to the second electrode, and
    the second side is closer to the first electrode than the first side is, in a plan view.

11. The display device according to claim 10, wherein the insulating pattern includes an organic insulating layer including an organic material and overlaps at least a portion of the second side of the third electrode.

12. The display device according to claim 9, further comprising:
    an insulating layer disposed on the first electrode and the second electrode,
    wherein the insulating layer includes:
       a first contact hole through which a portion of the first electrode is exposed, and
       a second contact hole through which a portion of the second electrode is exposed.

13. The display device according to claim 12, wherein
    the third electrode is electrically connected to the first electrode through the first contact hole,
    the fourth electrode is electrically connected to the second electrode through the second contact hole, and the third electrode and the fourth electrode are electrically disconnected from each other.

14. A method of fabricating a display device, comprising:
forming a first electrode and a second electrode on a substrate;
forming a first insulating material layer on the first electrode, the second electrode, and the substrate;
forming, by patterning the first insulating material layer, a first insulating layer exposing a portion of the first electrode and a portion of the second electrode;
supplying light emitting elements onto the first insulating layer and self-aligning the light emitting elements;
sequentially forming a conductive material layer and a second insulating material layer on the light emitting elements and the first insulating layer;
forming an insulating pattern exposing a first end of the light emitting element by patterning the conductive material layer and the second insulating material layer by a first etching process;
forming a third electrode by etching the patterned conductive material layer by a second etching process using the insulating pattern as a mask, wherein the third electrode includes an end overlapping the light emitting element, has an under-cut shape, and is electrically connected with a second end of the light emitting element; and
forming a fourth electrode electrically connected with the second electrode and the first end of the light emitting element on the first insulating layer.

15. The method according to claim 14, wherein
the first etching process comprises a dry etching process, and
the second etching process comprises a wet etching process.

16. The method according to claim 15, wherein
the insulating pattern comprises an organic insulating layer including an organic material,
the method further comprising curing the insulating pattern after the forming of the third electrode and the forming of the fourth electrode,
the insulating pattern fills at least a portion of the under-cut shape of the third electrode.

17. The method according to claim 16, wherein at least a portion of the insulating pattern contacts the light emitting element.

18. The method according to claim 15, wherein
the insulating pattern comprises an inorganic insulating layer including an inorganic material, and
the forming of the fourth electrode comprises forming a void surrounded by a portion of the light emitting element, a portion of the third electrode, a portion of the insulating pattern, and a portion of the fourth electrode.

19. The method according to claim 14, wherein the third electrode is electrically disconnected from the fourth electrode.

20. The method according to claim 14, further comprising forming a second insulating layer overlapping the third electrode and the fourth electrode on the third electrode and the fourth electrode.

* * * * *